(12) United States Patent
Park et al.

(10) Patent No.: US 12,359,344 B2
(45) Date of Patent: Jul. 15, 2025

(54) SILICON CARBIDE POWDER AND METHOD FOR MANUFACTURING SILICON CARBIDE INGOT USING THE SAME

(71) Applicant: Senic Inc., Chungcheongnam-do (KR)

(72) Inventors: Jong Hwi Park, Gyeonggi-do (KR);
Kap Ryeol Ku, Gyeonggi-do (KR);
Jung Gyu Kim, Gyeonggi-do (KR);
Jung Woo Choi, Gyeonggi-do (KR);
Jung Doo Seo, Gyeonggi-do (KR);
Myung Ok Kyun, Gyeonggi-do (KR)

(73) Assignee: Senic Inc., Chungcheongnam-do (KR)

( * ) Notice: Subject to any disclaimer, the term of this patent is extended or adjusted under 35 U.S.C. 154(b) by 252 days.

(21) Appl. No.: 18/087,156

(22) Filed: Dec. 22, 2022

(65) Prior Publication Data

US 2023/0203710 A1 Jun. 29, 2023

(30) Foreign Application Priority Data

Dec. 23, 2021 (KR) .................. 10-2021-0186628

(51) Int. Cl.
*C30B 29/36* (2006.01)
*C01B 32/956* (2017.01)
*C30B 23/02* (2006.01)

(52) U.S. Cl.
CPC ............ *C30B 29/36* (2013.01); *C01B 32/956* (2017.08); *C30B 23/02* (2013.01); *C01P 2004/61* (2013.01)

(58) Field of Classification Search
CPC ....... C30B 23/02; C30B 29/36; C01B 32/956; C01P 2004/61
See application file for complete search history.

(56) References Cited

U.S. PATENT DOCUMENTS

| 10,822,720 B1 | 11/2020 | Park et al. |
| 2002/0165078 A1 | 11/2002 | Otsuki et al. |
| 2004/0161376 A1 | 8/2004 | Otsuki et al. |
| 2012/0183466 A1 | 7/2012 | Sasaki |
| 2014/0004303 A1 | 1/2014 | Sasaki |
| 2016/0160386 A1 | 6/2016 | Masuda et al. |
| 2016/0289863 A1 | 10/2016 | Sasaki |
| 2021/0163301 A1 | 6/2021 | Park et al. |

FOREIGN PATENT DOCUMENTS

| CN | 102795626 A | 11/2012 |
| CN | 105503195 A | 4/2016 |
| CN | 105734673 A | 7/2016 |
| CN | 106185945 A | 12/2016 |
| CN | 107244919 A | 10/2017 |
| DE | 4224173 A1 | 1/1994 |
| EP | 2660362 A1 | 11/2013 |

(Continued)

OTHER PUBLICATIONS

Office Action for the Japanese Patent Application No. 2022-197515 issued by the Japanese Patent Office on Jan. 23, 2024.

(Continued)

*Primary Examiner* — Robert M Kunemund
(74) *Attorney, Agent, or Firm* — IP & T GROUP LLP

(57) ABSTRACT

Disclosed are a silicon carbide powder and a method of manufacturing a silicon carbide ingot using the same. More particularly, the silicon carbide powder includes carbon and silicon and has a particle circularity of 0.4 to 0.9 measured through 2D image analysis.

9 Claims, 9 Drawing Sheets

(56) References Cited

FOREIGN PATENT DOCUMENTS

| | | | |
|---|---|---|---|
| JP | 2002032676 | A | 1/2002 |
| JP | 2002293660 | A | 10/2002 |
| JP | 2002-326876 | A | 11/2002 |
| JP | 2003-202707 | A | 7/2003 |
| JP | 2008-001532 | A | 1/2008 |
| JP | 2010-222155 | A | 10/2010 |
| JP | 2011023094 | A | 2/2011 |
| JP | 2019-006651 | A | 1/2019 |
| JP | 2019-119663 | A | 7/2019 |
| JP | 2021014395 | A | 2/2021 |
| KR | 10-2012-0130318 | A | 11/2012 |
| KR | 10-2015-0053367 | A | 5/2015 |
| KR | 10-2016-0036527 | A | 4/2016 |
| KR | 10-2068933 | B1 | 1/2020 |
| KR | 10-2020-0077184 | A | 6/2020 |
| KR | 10-2218607 | B1 | 2/2021 |
| KR | 10-2021-0066523 | A | 6/2021 |
| KR | 10-2293576 | B1 | 8/2021 |
| WO | 2015/079906 | A1 | 6/2015 |

OTHER PUBLICATIONS

Extended European Search Report for the European Patent Application No. 22209769.3 issued by the European Patent Office on May 23, 2023.

Office Action for Chinese Patent Application No. 202211665374.6 issued by the Chinese Patent Office on Jan. 27, 2025.

SILICON CARBIDE POWDER AND METHOD FOR MANUFACTURING SILICON CARBIDE INGOT USING THE SAME

CROSS-REFERENCE TO RELATED APPLICATION

This application claims benefit of priority to Korean Patent Application No. 10-2021-0186628 filed on Dec. 23, 2021 in the Korean Intellectual Property Office, the disclosure of which is incorporated herein by reference in its entirety.

TECHNICAL FIELD

An embodiment relates to a silicon carbide powder and a method of manufacturing a silicon carbide ingot.

BACKGROUND ART

Silicon carbide (SiC) has excellent heat resistance and mechanical strength, has strong radiation-resistant properties, and is advantageous in that it can be used to manufacture in a large-diameter substrate. In addition, silicon carbide has excellent physical strength and chemical resistance, a large energy band gap, and a larger electron saturation drift rate and withstand pressure. Therefore, it is widely used for abrasives, bearings, fireproof plates, etc. as well as semiconductor devices requiring high power, high efficiency, high-pressure resistance, and large capacity.

Silicon carbide is manufactured by various methods such as heat treatment or energization of carbon raw materials such as silicon carbide waste. As conventional methods, there are the Acheson method, a reaction sintering method, an atmospheric pressure sintering method, a chemical vapor deposition (CVD) method, and the like. However, these methods have a problem in that carbon raw materials remain, and are disadvantageous in that these residues act as impurities, which can deteriorate the thermal, electrical, and mechanical properties of silicon carbide.

For example, Japanese Patent Application Publication No. 2002-326876 discloses a method of reacting a silicon carbide precursor, which has undergone a heat treatment process, at a high temperature under the condition of an inert gas such as argon (Ar) so as to polymerize or cross-link a silicon source and a carbon source. However, such a process has problems in that the manufacturing cost is high and the size of a powder is not uniform because heat treatment is performed at a high temperature of 1,800° C. to 2,100° C. under vacuum or inert gas conditions.

Moreover, wafers used in the solar cell and semiconductor industries are manufactured by growing from a silicon ingot in a crucible made of graphite or the like, and in this manufacturing process, not only waste slurry containing silicon carbide, but also silicon carbide waste adsorbed on the inner wall of the crucible is generated in a significant amount. Until now, such wastes have been disposed of in landfills, causing environmental problems and resulting in high disposal costs.

DISCLOSURE

Technical Problem

Therefore, the present invention has been made in view of the above problems, and it is one object of the present invention to provide a silicon carbide powder capable of improving the growth rate of a silicon carbide ingot and lowering the defects of a silicon carbide wafer; and a method of manufacturing a silicon carbide wafer using the silicon carbide powder.

Technical Solution

In accordance with an aspect of the present invention, the above and other objects can be accomplished by the provision of a silicon carbide powder, including carbon and silicon, wherein a particle circularity measured through 2D image analysis is 0.4 to 0.9.

In an embodiment, a particle ellipticity measured through the 2D image analysis may be 0.92 or more.

In an embodiment, a particle curvature measured through the 2D image analysis may be 0.8 to 0.99.

In an embodiment, a particle elongation measured through the 2D image analysis may be 0.7 to 0.95.

In an embodiment, a charge space elongation measured through the 2D image analysis may be 0.6 to 0.9.

In an embodiment, a charge space curvature measured through the 2D image analysis may be 0.8 to 0.95.

In an embodiment, an equivalent circle diameter measured through the 2D image analysis may be 200 μm to 350 μm.

In an embodiment, an equivalent circle diameter measured through the 2D image analysis may be 350 μm to 700 μm.

In an embodiment, an equivalent circle diameter measured through the 2D image analysis may be 800 μm to 3500 μm.

In accordance with another aspect of the present invention, there is provided a method of manufacturing a silicon carbide wafer, the method including: preparing a silicon carbide powder including a silicon carbide powder carbon and silicon and having a particle circularity of 0.4 to 0.9 measured through 2D image analysis; growing a silicon carbide ingot using the silicon carbide powder; and processing the silicon carbide ingot.

In an embodiment, in the growing, the silicon carbide powder may be filled in a crucible, wherein the silicon carbide powder filled in the crucible has a porosity of 10 vol % to 50 vol %, and in the growing, the silicon carbide ingot may have a growth rate of 250 μm to 400 μm.

Advantageous Effects

A silicon carbide powder according to an embodiment has particle circularity in an appropriate range. In addition, the silicon carbide powder according to an embodiment can have a particle ellipticity in an appropriate range. In addition, the silicon carbide powder according to an embodiment can have a particle curvature in an appropriate range. In addition, the silicon carbide powder according to an embodiment can have a particle elongation in an appropriate range. In addition, the silicon carbide powder according to an embodiment can have a charge space elongation in an appropriate range. In addition, the silicon carbide powder according to an embodiment can have a charge space curvature in an appropriate range.

Accordingly, when the silicon carbide powder according to an embodiment is filled in a crucible to manufacture a silicon carbide ingot and a silicon carbide wafer, an appropriate shape allowing the implementation of an appropriate porosity and an appropriate thermal conductivity can be provided.

Accordingly, when the silicon carbide powder according to an embodiment is filled in the crucible, improved thermal conductivity in a horizontal direction and a porosity in an appropriate range can be provided. Accordingly, when the silicon carbide powder according to an embodiment is filled in the crucible and heated for the growth of the silicon carbide ingot, a uniform temperature gradient in the horizontal direction can be provided, and the silicon carbide gas sublimated into the pores can be easily transferred to the silicon carbide seed.

Accordingly, the silicon carbide powder according to an embodiment can transfer the sublimated silicon carbide gas upward at an improved rate and at a uniform rate. Therefore, the silicon carbide powder according to an embodiment can improve the growth rate of the silicon carbide ingot. In addition, since the silicon carbide gas is sublimed at a uniform rate as a whole, defects of the silicon carbide ingot and the silicon carbide wafer can be reduced.

The growth process of the silicon carbide ingot may depend upon the particle shape of the silicon carbide powder according to the embodiment. At this time, the particle shape and particle surface properties of the silicon carbide powder can be appropriately controlled by the crushing process, the pulverizing process, and the etching process. Through the 2D image analysis, the particle shape and particle surface characteristics of the silicon carbide powder according to an embodiment can be determined. When the silicon carbide powder according to an embodiment has a particle circularity, particle ellipticity, particle curvature, particle elongation, charge space elongation, and charge space curvature in appropriate ranges, it can have a particle shape and surface that positively affect the growth of the silicon carbide ingot.

BEST MODE

Figure 1:
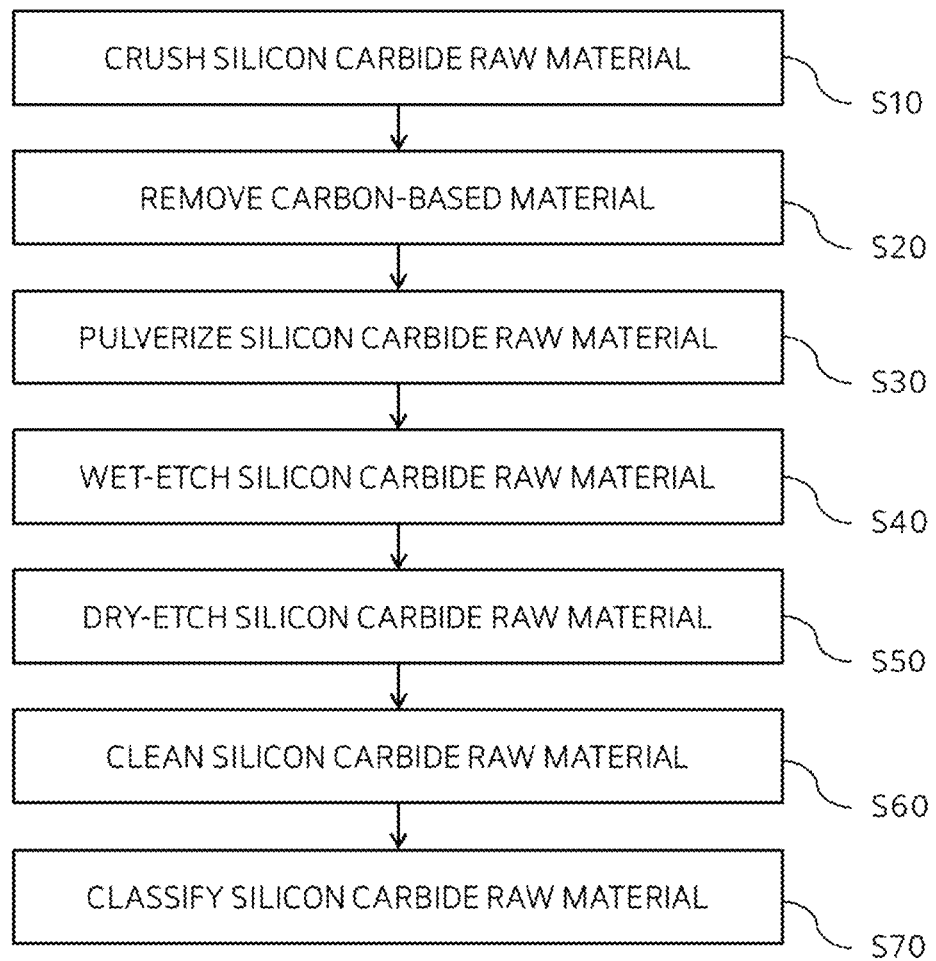
FIG. 1 is a flowchart illustrating a process of manufacturing a silicon carbide powder according to one embodiment.

Hereinafter, the invention will be described in detail through embodiments. The embodiments are not limited to contents disclosed below and may be modified in various forms so long as the gist of the invention is not changed.

In the present specification, when a part "comprises" a certain component, it means that other components may be further comprised, rather than excluding other components, unless otherwise specified.

It should be understood that all numbers and expressions indicating the amounts of components, reaction conditions, etc. described in this specification are modified by the term "about" in all cases unless otherwise specified.

First, a method of manufacturing a silicon carbide powder according to an embodiment includes a step of preparing a silicon carbide raw material.

The silicon carbide raw material includes silicon carbide. The silicon carbide raw material may include α-phase silicon carbide and/or -phase silicon carbide. In addition, the silicon carbide raw material may include a silicon carbide monocrystal and/or a silicon carbide polycrystal.

In addition, the silicon carbide raw material may further include unwanted impurities in addition to silicon carbide.

The silicon carbide raw material may further include a carbon-based material such as graphite as an impurity. The carbon-based material may be derived from a graphite crucible and the like. The carbon-based material may include the silicon carbide raw material in a content of about 5% by weight to about 50% by weight. The carbon-based material may be included in a content of about 50% by weight or less in the silicon carbide raw material. The carbon-based material may be included in a content of about 45% by weight or less in the silicon carbide raw material. The carbon-based material may be included in a content of about 40% by weight or less in the silicon carbide raw material. The carbon-based material may be included in a content of about 1% by weight to about 50% by weight in the silicon carbide raw material. The carbon-based material may be included in a content of about 5% by weight to about 45% by weight in the silicon carbide raw material. The carbon-based material may be included in a content of about 10% by weight to about 40% by weight in the silicon carbide raw material. The carbon-based material may be included in a content of about 10% by weight to about 35% by weight in the silicon carbide raw material. The carbon-based material may be included in a content of about 10% by weight to about 30% by weight in the silicon carbide raw material. The carbon-based material may be included in a content of about 10% by weight to about 20% by weight in the silicon carbide raw material.

The silicon carbide raw material may further include free silicon as the impurity The free silicon may be derived from a silicon substrate and/or a silicon component, etc. The silicon component may be a component applied to a semiconductor equipment such as a focus ring. The free silicon may be included in a content of about 0.01% by weight to about 10% by weight in the silicon carbide raw material.

The silicon carbide raw material may further include a metallic impurity. The metallic impurity may be at least one selected from the group consisting of lithium, boron, sodium, aluminum, phosphorus, potassium, calcium, titanium, vanadium, chromium, manganese, iron, nickel, copper, zinc, strontium, zirconium, molybdenum, tin, barium, tungsten, and lead.

The content of the metallic impurity may be about 0.1 ppm to 13 ppm. The content of the metallic impurity may be about 0.3 ppm to 12 ppm. The content of the metallic impurity may be about 0.5 ppm to 8 ppm. The content of the metallic impurity may be about 0.8 ppm to 10 ppm. The content of the metallic impurity may be about 1 ppm to 6 ppm. The content of the metallic impurity may be about 0.1 ppm to 5 ppm. The content of the metallic impurity may be about 0.5 ppm to 3 ppm. The content of the metallic impurity may be about 0.5 ppm to 2 ppm. The silicon carbide raw material may further include a metallic impurity.

The silicon carbide raw material may further include a non-metallic impurity. The non-metallic impurity may be selected from the group consisting of fluorine, nitrogen, chlorine, and phosphorus.

The content of the non-metallic impurity may be about 0.01 ppm to 13 ppm. The content of the non-metallic impurity may be about 0.03 ppm to 12 ppm. The content of the non-metallic impurity may be about 0.05 ppm to 8 ppm. The content of the non-metallic impurity may be about 0.08 ppm to 10 ppm. The content of the non-metallic impurity may be about 0.1 ppm to 6 ppm. The content of the non-metallic impurity may be about 0.1 ppm to 5 ppm. The content of the non-metallic impurity may be about 0.5 ppm to 3 ppm. The content of the non-metallic impurity may be about 0.5 ppm to 2 ppm.

The silicon carbide raw material may have a lump shape. The silicon carbide raw material may have a plate shape.

The silicon carbide raw material includes about 30% by weight or more of particles having diameter of about 1 mm or more. The silicon carbide raw material may include about 50% by weight or more of particles having diameter of about 1 mm or more. The silicon carbide raw material may include about 70% by weight or more of particles having diameter of about 1 mm or more.

The silicon carbide raw material includes about 30% by weight or more of particles having diameter of about 10 mm or more. The silicon carbide raw material may include about 50% by weight or more of particles having diameter of about 10 mm or more. The silicon carbide raw material may include about 70% by weight or more of particles having diameter of about 10 mm or more.

Here, a sphere having the same volume as the volume of the particle is assumed, and the diameter of the sphere is defined as the particle diameter.

In addition, the silicon carbide raw material may be derived from a substrate including silicon carbide. The silicon carbide raw material may be derived from a wafer entirely including silicon carbide. The silicon carbide raw material may be derived from a silicon carbide layer, deposited on a substrate, such as silicon.

In addition, the silicon carbide raw material may be derived from a silicon carbide monocrystal ingot. The silicon carbide monocrystal ingot may be discarded due to defects occurring during the manufacturing process. Alternatively, the silicon carbide raw material may be derived from a silicon carbide polycrystal.

The silicon carbide raw material may be derived from a silicon carbide sintered body. The silicon carbide sintered body may be formed by sintering a silicon carbide powder. The silicon carbide sintered body may be a component included in semiconductor manufacturing equipment.

The silicon carbide raw material may be derived from a graphite component including a silicon carbide layer. The graphite component may include a crucible for forming a silicon carbide ingot, etc.

The silicon carbide raw material may be derived from a component of a semiconductor equipment including a silicon carbide layer. The silicon carbide layer may be formed by depositing silicon carbide on the surface on a silicon component, etc. by a chemical vapor deposition (CVD) process.

The method of manufacturing a silicon carbide powder according to an embodiment may include a step of cutting the silicon carbide raw material.

When the silicon carbide raw material is too large, the silicon carbide raw material may be cut a wire saw or bar cutting by including diamond abrasive grains, etc. The silicon carbide raw material may be cut to a length of 150 mm.

The method of manufacturing a silicon carbide powder according to an embodiment may include a step of crushing a silicon carbide raw material.

The step of crushing a silicon carbide raw material may be a process of breaking the silicon carbide raw material into particles having an average particle diameter of about 100 mm or less. By the crushing process, the silicon carbide raw material may be split into particles having an average particle diameter of about 80 mm or less. By the crushing process, the silicon carbide raw material may be split into particles having an average particle diameter of about 60 mm or less. By the crushing process, the silicon carbide raw material may be split into particles having an average particle diameter of about 50 mm or less. By the crushing process, the silicon carbide raw material may be split into particles having an average particle diameter of about 0.1 mm to about 50 mm. By the crushing process, the silicon carbide raw material may be split into particles having an average particle diameter of about 1 mm to about 40 mm.

In the crushing process, a jaw crusher, a cone crusher, or a gyratory crusher may be used.

The jaw crusher includes a pair of compression plates, and the silicon carbide raw material is inserted between the compression plates. The silicon carbide raw material is crushed by the pressure applied through the compression plates, and the crushed silicon carbide raw material may be discharged downward by magnetic gravity.

Each of the compression plates may include at least one of steel, stainless steel, manganese-added steel, chromium-added steel, nickel-added steel, molybdenum-added steel, nitrogen-added steel, and tungsten carbide. A portion of the compression plate in direct contact with the silicon carbide raw material may be made of at least one of steel, stainless steel, manganese-added steel, chromium-added steel, nickel-added steel, molybdenum-added steel, nitrogen-added steel, and tungsten carbide. A portion of the compression plate in direct contact with the silicon carbide raw material may be coated with the tungsten carbide.

The gyratory crusher includes a crushing head and a crushing bowl accommodating the crushing head. The crushing head has a truncated cone shape, and the crushing head is mounted on a shaft. An upper end of the crushing head is fixed to a flexible bearing, and a lower end of the crushing head is driven eccentrically to draw a circle. The crushing action is made around the entire cone, and the maximum movement is made at the bottom. Accordingly, since the crushing of the gyratory crusher continues to operate, the gyratory crusher has less stress fluctuation and lower power consumption than the jaw crusher.

Like the jaw crusher, the crushing head and the crushing bowl which are parts in direct contact with the silicon carbide raw material may include at least one of steel, stainless steel, manganese-added steel, chromium-added steel, nickel-added steel, molybdenum-added steel, nitrogen-added steel, and tungsten carbide. Portions of the crushing head and the crushing bowl which are in direct contact with the silicon carbide raw material may be made of at least one of steel, stainless steel, manganese-added steel, chromium-added steel, nickel-added steel, molybdenum-added steel, nitrogen-added steel, and tungsten carbide. Portions of the crushing head and the crushing bowl in direct contact with the silicon carbide raw material may be coated with the tungsten carbide.

The cone crusher is a device for the silicon carbide raw material by impact force and compression force. The cone crusher has a similar structure and crushing motion to the gyratory crusher. However, the cone crusher may have shorter cones. The cone crusher includes an umbrella-shaped cone mantle head mounted on a vertical central axis. By the eccentric motion of the cone mantle head, the silicon carbide raw material is bitten into a cone cave bowl, and as it goes down, the silicon carbide raw material is crushed.

Like the jaw crusher, the cone mantle head and the cone cave bowl whish are parts in direct contact with the silicon carbide raw material may include at least one of steel, stainless steel, manganese-added steel, chromium-added steel, nickel-added steel, molybdenum-added steel, nitrogen-added steel, and tungsten carbide. Portions of the cone mantle head and the cone cave bowl in direct contact with the silicon carbide raw material may be made of at least one of steel, stainless steel, manganese-added steel, chromium-added steel, nickel-added steel, molybdenum-added steel, nitrogen-added steel, and tungsten carbide. Portion of the cone mantle head and the cone cave bowl in direct contact with the silicon carbide raw material may be coated with the tungsten carbide.

The method of manufacturing a silicon carbide powder according to an embodiment may include a step of pulverizing a silicon carbide raw material.

The step of pulverizing a silicon carbide raw material may include a process of breaking the silicon carbide raw material into particles having a diameter of about 30 mm or less. By the pulverization process, the silicon carbide raw material may be split into particles having an average particle diameter of about 20 mm or less. By the pulverization process, the silicon carbide raw material may be split into particles having an average particle diameter of about 15 mm or less. By the pulverization process, the silicon carbide raw material may be split into particles having an average particle diameter of about 10 mm or less. By the pulverization process, the silicon carbide raw material may be split into particles having an average particle diameter of about 0.1 mm to about 10 mm. By the pulverization process, the silicon carbide raw material may be split into particles having an average particle diameter of about 0.1 mm to about 8 mm. By the pulverization process, the silicon carbide raw material may be split into particles having an average particle diameter of about 0.01 mm to about 6 mm.

In the pulverization process, a ball mill, a hammer crusher, a jet mill, or the like may be used.

The ball mill may include a metal cylinder and a ball. The ball and the silicon carbide raw material are placed in the metal cylinder. When the metal cylinder rotates, the ball and the silicon carbide raw material can be rotated by the friction between the ball and the silicon carbide raw material and the centrifugal force within the metal cylinder. At this time, the ball and the silicon carbide raw material rise to a certain height in the cylinder, and then fall, and the silicon carbide raw material is pulverized and polished. Depending on the rotational speed of the cylinder, the inner diameter of the cylinder, the size of the ball, the material of the ball, and the time of the pulverization process, the silicon carbide raw material may be split into particles having a small diameter.

The metal cylinder and the ball which are parts in direct contact with the silicon carbide raw material may include at least one of steel, stainless steel, manganese-added steel, chromium-added steel, nickel-added steel, molybdenum-added steel, nitrogen-added steel, and tungsten carbide. Portion of the metal cylinder and the ball in direct contact with the silicon carbide raw material may be made of at least one of steel, stainless steel, manganese-added steel, chromium-added steel, nickel-added steel, molybdenum-added steel, nitrogen-added steel, and tungsten carbide. Portions of the metal cylinder and the ball in direct contact with the silicon carbide raw material may be coated with the tungsten carbide.

The hammer crusher includes a chamber and multiple hammers. The hammers are mounted on a rotating body placed within the chamber. The hammers rotate within the chamber, and the hammers impact on the silicon carbide raw material. Accordingly, the silicon carbide raw material may be split into particles having a small diameter.

The chamber and the hammers which are parts in direct contact with the silicon carbide raw material may include at least one of steel, stainless steel, manganese-added steel, chromium-added steel, nickel-added steel, molybdenum-added steel, nitrogen-added steel, and tungsten carbide. Portions of the chamber and the hammers in direct contact with the silicon carbide raw material may be made of at least one of steel, stainless steel, manganese-added steel, chromium-added steel, nickel-added steel, molybdenum-added steel, nitrogen-added steel, and tungsten carbide. Portions of the chamber and the hammers in direct contact with the silicon carbide raw material may be coated with the tungsten carbide.

The jet mill pulverizes the silicon carbide raw material by mutually colliding the silicon carbide raw material with the energy of injection from the nozzle by the pressure of a fluid. The silicon carbide raw material is pulverized in the chamber until the particle size thereof reaches a desired size. In addition, the particles subjected to the pulverization process are collected through a classification chamber from the chamber. Since the jet mill pulverizes the silicon carbide raw material by mutual collision of the silicon carbide raw material by the pressure of fluid, the contamination of the silicon carbide raw material by direct contact with other devices may be minimized.

The chamber which is a part in direct contact with the silicon carbide raw material may include at least one of steel, stainless steel, manganese-added steel, chromium-added steel, nickel-added steel, molybdenum-added steel, nitrogen-added steel, and tungsten carbide. A portion of the chamber which is in direct contact with the silicon carbide raw material may be made of at least one of steel, stainless steel, manganese-added steel, chromium-added steel, nickel-added steel, molybdenum-added steel, nitrogen-added steel, and tungsten carbide. A portion of the chamber which is in direct contact with the silicon carbide raw material may be coated with the tungsten carbide.

The average particle diameter (D50) of the crushed particles may be about 1 mm to about 15 mm, and the average particle diameter (D50) of the crushed particles may be about 100 μm to about 3 mm. The average particle diameter (D50) of the crushed particles may be about 3 mm to about 10 mm, and the average particle diameter (D50) of the crushed particles may be about 100 μm to about 1 mm. The average particle diameter (D50) of the crushed particles may be about 1 mm to about 3 mm, and the average particle diameter (D50) of the crushed particles may be about 300 μm to about 0.8 mm. The average particle diameter (D50) of the crushed particles may be about 7 mm to about 13 mm, and the average particle diameter (D50) of the crushed particles may be about 500 μm to about 1.5 mm. The average particle diameter (D50) of the crushed particles may be about 1 mm to about 3 mm, and the average particle diameter (D50) of the crushed particles may be about 100 µm to about 800 µm. The average particle diameter (D50) of the crushed particles may be about 6 mm to about 10 mm, and the average particle diameter (D50) of the crushed particles may be about 1 mm to about 3 mm. The average particle diameter (D50) of the crushed particles may be about 4 mm to about 8 mm, and the average particle diameter (D50) of the crushed particles may be about 800 µm to about 2 mm. Since the crushing process and the pulverizing process are carried out to have an average particle diameter (D50) within the above range, the silicon carbide powder according to an embodiment may be manufactured to have a desired particle diameter and shape.

The pulverization process may be a ball mill process. In the ball mill process, the diameter of a ball may be about 5 mm to about 50 mm. The diameter of the ball may be about 10 mm to about 40 mm.

In the ball mill process, the rotation speed of a cylinder may be about 10 rpm to about 40 rpm. In the ball mill process, the rotation speed of the cylinder may be about 15 rpm to about 35 rpm.

In the ball mill process, a steel ball may be used. The ball mill process may be carried out for about 10 minutes to about 30 minutes.

To appropriately control the particle size and shape of the silicon carbide powder according to an embodiment, a ball diameter and cylinder rotation speed in the ball mill process and the time of the ball mill process may be controlled appropriately.

The method of manufacturing a silicon carbide powder according to an embodiment may further include a step of removing iron by magnetic force.

The step of removing an iron component may be a step of removing iron adsorbed to the silicon carbide raw material in the crushing and pulverizing steps.

In the step of removing an iron component, a rotary metal detector may be used to remove the iron.

A rotation speed of the rotary metal detector may be about 100 rpm to about 800 rpm, and an output of an electromagnet included in the rotary metal detector may be about 0.5 kW to about 3 kW. In addition, a rotation speed of the rotary metal detector may be about 800 rpm to about 1700 rpm, and an output of an electromagnet included in the rotary metal detector may be about 3 kW to about 5 kW.

The content of iron contained in the silicon carbide raw material from which iron has been removed may be about 1 ppm or less. The content of iron contained in the silicon carbide raw material from which iron has been removed about 0.5 ppm or less. The content of iron contained in the silicon carbide raw material from which iron has been removed about 0.3 ppm or less. The content of iron contained in the silicon carbide raw material from which iron has been removed about 0.1 ppm or less.

The method of manufacturing a silicon carbide powder according to an embodiment includes a step of removing the carbon-based material.

The step of removing the carbon-based material may include a step of physically removing the carbon-based material.

The step of physically removing the carbon-based material may include a steel cut wire shot process. A wire used for the steel cut wire shot may be made of carbon steel, stainless steel, aluminum, zinc, nickel, copper, or an alloy thereof, but is not limited thereto. In addition, the diameter of the wire may be about 0.2 mm to about 0.8 mm. The diameter of the wire may be about 0.4 mm to about 0.6 mm.

A rotation speed of the wire may be about 1000 rpm to about 5000 rpm.

In addition, the step of physically removing the carbon-based material may include a blasting process such as sandblasting or short blasting. The blasting process may be a process of spraying fine particles on the carbon-based material such as graphite to remove the carbon-based material. That is, since the carbon-based material has a lower hardness than the silicon carbide, it can be removed easily by fine particles sprayed with an appropriate pressure.

In addition, the step of physically removing the carbon-based material may include a separation process using density difference, such as centrifugation. The crushed and/or pulverized silicon carbide raw material may be separated by a density difference between the carbon-based material and the silicon carbide. That is, since the density of silicon carbide is larger than the density of graphite, the carbon-based material may be easily removed by density gradient centrifugation, etc.

After the step of physically removing the carbon-based material, the content of the carbon-based material included in the raw material may be about 5% by weight or less. After the step of removing the carbon-based material, the content of the carbon-based material included in the raw material may be about 3% by weight or less. After the step of removing the carbon-based material, the content of the carbon-based material included in the raw material may be about 1% by weight or less.

In addition, the step of removing the carbon-based material includes a step of chemically removing the carbon-based material.

The step of chemically removing the carbon-based material includes a step of oxidizing the carbon-based material.

After the carbon-based material contained in the raw material is sufficiently removed, the raw material is heat-treated in an oxygen or atmospheric atmosphere. At this time, the oxidative heat treatment temperature may be about 1000° C. to about 1200° C. The heat treatment time may be about 12 hours to about 48 hours.

Since the raw material is heat-treated in the above time and temperature ranges, the carbon-based material contained in the raw material may be effectively removed. In addition, since the raw material is heat-treated in the above time and temperature ranges, the generation of by-products such as silicon oxide in the raw material may be minimized.

The method of manufacturing a silicon carbide powder according to an embodiment includes a step of classifying the silicon carbide raw material. In the classifying step, the silicon carbide raw material granulated through the crushing process and the pulverizing process may be classified.

The granulated silicon carbide raw material may be classified by a mesh of a desired size.

The classifying step may be performed using a twist screen that is a vibrating classifying device.

The twist screen may include a silicon material-made tapping ball having a diameter of 10 mm to 80 mm, 15 mm to 70 mm, or 20 mm to 60 mm. Using the twist screen, the classifying step may be performed for about 10 minutes to about 100 minutes under a vibration condition of about 1000 times/minute to about 3000 times/minute.

The granulated silicon carbide raw material may be fed into the twist screen at a constant speed.

The particle diameter (D50) of the granulated silicon carbide raw material may be about 10 µm to about 10000 µm. The particle diameter (D50) of the granulated silicon carbide raw material may be about 100 μm to about 6000 μm. The particle diameter (D50) of the granulated silicon carbide raw material may be about 60 μm to about 5000 μm. The particle diameter (D50) of the granulated silicon carbide raw material may be about 100 μm to about 4000 μm. The particle diameter (D50) of the granulated silicon carbide raw material may be about 150 μm to about 400 μm. The particle diameter (D50) of the granulated silicon carbide raw material may be about 300 μm to about 800 μm. The particle diameter (D50) of the granulated silicon carbide raw material may be about 500 μm to about 1000 μm. The particle diameter (D50) of the granulated silicon carbide raw material may be about 700 μm to about 2000 μm. The particle diameter (D50) of the granulated silicon carbide raw material may be about 1000 μm to about 3000 μm.

The method of manufacturing a silicon carbide powder according to an embodiment may include a step of wet etching the silicon carbide raw material.

The wet etching step is carried out by an etchant. The silicon carbide raw material that has undergone the crushing and pulverizing processes may be subjected to the wet etching step.

The etchant may include water and acid. The acid may be at least one selected from the group consisting of hydrofluoric acid, nitric acid, hydrochloric acid, and sulfuric acid.

The etchant may include deionized water, hydrofluoric acid, and nitric acid.

The hydrofluoric acid may be included in a content of about 10 parts by weight to about 50 parts by weight based on 100 parts by weight of the deionized water in the etchant. The hydrofluoric acid may be included in a content of about 15 parts by weight to about 45 parts by weight based on 100 parts by weight of the deionized water in the etchant. The hydrofluoric acid may be included in a content of about 20 parts by weight to about 40 parts by weight based on 100 parts by weight of the deionized water in the etchant.

The nitric acid may be included in a content of about 10 parts by weight to about 50 parts by weight based on 100 parts by weight of the deionized water in the etchant. The nitric acid may be included in a content of about 15 parts by weight to about 45 parts by weight based on 100 parts by weight of the deionized water in the etchant. The nitric acid may be included in a content of about 20 parts by weight to about 40 parts by weight based on 100 parts by weight of the deionized water in the etchant.

The etchant may be filled in an etch vessel. Here, the etchant may be filled in an amount of about 10 vol % to about 20 vol % based on the total volume of the etch vessel in the etch vessel. The etchant may be filled in an amount of about 12 vol % to about 18 vol % based on the total volume of the etch vessel in the etch vessel. In addition, the silicon carbide raw material may be filled in an amount of about 10 vol % to about 30 vol % based on the total volume of the etch vessel in the etch vessel. The silicon carbide raw material may be filled in an amount of about 15 vol % to about 25 vol % based on the total volume of the etch vessel in the etch vessel.

The silicon carbide raw material may be wet-etched by the etchant. That is, the surface of the silicon carbide raw material may be etched by the etchant, and impurities remaining on the surface of the silicon carbide raw material may be removed by the etchant.

The wet etching step may be carried out according to the following processes.

First, the etch vessel and the silicon carbide raw material may be dried. The etch vessel and the silicon carbide raw material may be dried with hot air at about 50° C. to about 150° C. for about 10 minutes to about 1 hour.

Next, the silicon carbide raw material is placed in the etch vessel.

Next, the etchant is fed into the etch vessel in which the silicon carbide raw material has been placed.

A process of feeding the etchant may be as follows.

First, deionized water is fed into the etch vessel in which the silicon carbide raw material has been placed.

Next, hydrofluoric acid is fed into the etch vessel into which the deionized water has been fed.

Next, nitric acid is fed into the etch vessel into which the hydrofluoric acid has been fed.

Next, the etch vessel into which the etchant has been fed is sealed by a lid, the silicon carbide raw material and etchant contained in the etch vessel are stirred at a speed of about 50 rpm to about 500 rpm. The stirring time may be about 30 minutes to about 2 hours.

Next, the etchant is drained, and the silicon carbide raw material subjected to the wet etching process is precipitated several times in deionized water and neutralized. At this time, after precipitation, the neutralization process of the silicon carbide raw material that has undergone the wet etching process may be completed based on the content and/or pH of hydrofluoric acid contained in the drained wastewater. When the pH of the wastewater is 6.8 to 7.2, the neutralization process may be finished.

The method of manufacturing a silicon carbide powder according to an embodiment may include a step of dry etching the silicon carbide raw material.

The dry etching process may be performed by spraying an etching gas onto the silicon carbide raw material.

The etching gas may include a chlorine gas. The etching gas may further include an inert gas such as argon as a carrier gas.

The dry etching process may be carried out as follows.

First, a dry etching furnace is prepared. The dry etching furnace may be made of graphite and may be heated to a temperature of about 2000° C. or more. The dry etching furnace is sealed against the outside, and the inside of the dry etching furnace may be depressurized up to about 5 torr or less.

The silicon carbide raw material is placed in the dry etching furnace.

Next, the dry etching furnace is heated up to a temperature of about 1800° C. to about 2200° C.

Next, the inside of the dry etching furnace is depressurized to a pressure of about 1 torr to about 30 torr. The inside of the dry etching furnace is depressurized to a pressure of about 1 torr to about 10 torr. The inside of the dry etching furnace is depressurized to a pressure of about 1 torr to about 8 torr.

Next, the etching gas is fed into the dry etching furnace. The etching gas may be convected in the dry etching furnace by a temperature difference between the lower portion and the upper portion of the dry etching furnace. That is, the temperature of the lower portion of the dry etching furnace is about 50° C. to about 100° C. higher than the temperature of the upper portion of the dry etching furnace, so that the etching gas at the lower portion of the dry etching furnace moves to the upper portion of the dry etching furnace, thereby dry etching the surface of the silicon carbide raw material. The residence time of the etching gas in the dry etching furnace may be about 24 hours to about 96 hours.

Next, the etching gas may be removed by a wet scrubber, and the pressure of the inside of the dry etching furnace may be increased to about 600 torr to about 780 torr.

The dry etching process may additionally include a heat treatment process and an oxide film removal process.

The dry-etched silicon carbide particles may be heat-treated at about 700° C. to about 1300° C. in an atmosphere containing oxygen in the dry etching furnace. The dry-etched silicon carbide particles may be heat-treated at about 800° C. to about 1200° C. in an atmosphere containing oxygen in the dry etching furnace. The dry-etched silicon carbide particles may be heat-treated at about 900° C. to about 1100° C. in an atmosphere containing oxygen in the dry etching furnace. The heat treatment time may be about 10 minutes to about 2 hours. The heat treatment time may be about 20 minutes to about 1 hour.

By the heat treatment, chlorine remaining on the surface of the dry-etched silicon carbide particles may be easily removed.

The oxide film removal process may include a wet etching process.

The heat-treated silicon carbide raw material is fed into an etch vessel, and deionized water and hydrofluoric acid are additionally fed into the etch vessel.

Next, the silicon carbide raw material and etchant in the etch vessel may be stirred, and an oxide film on the surface of the silicon carbide raw material may be removed.

The silicon carbide raw material from which the oxide film has been removed is neutralized by deionized water.

The method of manufacturing a silicon carbide powder according to an embodiment may include a step of cleaning the silicon carbide raw material.

The cleaning process may be carried out using a cleaning solution including at least one selected from the group consisting of hydrofluoric acid, distilled water, and ultrapure water.

The cleaning process may include a first cleaning step, a first hydrofluoric acid treatment step, a second cleaning step, a second hydrofluoric acid treatment step, and a third cleaning step.

The first cleaning step may be performed for 1 minute to 300 minutes using distilled water, ultrapure water, or pure water. For example, the first cleaning step may be performed for about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes, or about 20 minutes to about 40 minutes.

Next, the first hydrofluoric acid treatment step is a step of cleaning the silicon carbide raw material using a cleaning solution including hydrofluoric acid. The silicon carbide raw material may be stirred for about 1 minute to about 300 minutes, about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes or about 20 minutes to about 40 minutes in the cleaning solution. Next, the silicon carbide raw material may be precipitated in the cleaning solution. The silicon carbide raw material may be precipitated for about 1 minute to about 300 minutes, about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes, or about 20 minutes to about 40 minutes in the cleaning solution.

The second cleaning step may be performed for 1 minute to 300 minutes using distilled water, ultrapure water, or pure water. For example, the second cleaning step may be performed for about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes, or about 20 minutes to about 40 minutes.

Next, the second hydrofluoric acid treatment step is a step of cleaning the silicon carbide raw material using a cleaning solution including hydrofluoric acid. The silicon carbide raw material may be stirred for about 1 minute to about 300 minutes, about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes, or about 20 minutes to about 40 minutes in the cleaning solution. Next, the silicon carbide raw material may be precipitated in the cleaning solution. The silicon carbide raw material may be precipitated for about 1 minute to about 300 minutes, about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes, or about 20 minutes to about 40 minutes in the cleaning solution.

The third cleaning step may be performed for 1 minute to 300 minutes using distilled water, ultrapure water, or pure water. For example, the third cleaning step may be performed for about 1 minute to about 250 minutes, about 1 minute to about 200 minutes, about 3 minutes to about 150 minutes, about 10 minutes to about 100 minutes, about 15 minutes to about 80 minutes, about 20 minutes to about 60 minutes, or about 20 minutes to about 40 minutes.

By the graphite removal process, the iron component removal process, the wet etching process, the dry etching process, and the cleaning process, the silicon carbide powder according to an embodiment may have a very high purity.

Referring to FIG. 1, a silicon carbide powder according to one embodiment may be manufactured by the following process.

First, the silicon carbide raw material is crushed in the crushing process (S10).

Next, by the carbon-based material removal process, a carbon-based material such as graphite included in the silicon carbide raw material is removed (S20).

Next, the silicon carbide raw material from which a carbon-based material has been removed is pulverized by the pulverization process (S30).

Next, the pulverized silicon carbide raw material is etched by a wet etching process (S40). Accordingly, impurities adhering to the surface of the pulverized silicon carbide may be efficiently removed. In particular, the carbon-based material remaining in the pulverized silicon carbide raw material may float in the etchant and may react with hydrofluoric acid, etc. included in the etchant. Accordingly, in the wet etching process, not only metallic impurities but also the carbon-based material may be efficiently removed.

Next, the wet etched silicon carbide raw material is etched by a dry etching process (S50).

Next, the dry-etched silicon carbide raw material is subjected to a cleaning process (S60).

Next, the cleaned silicon carbide raw material may be classified into particles having a desired particle size (S70).

Figure 2:
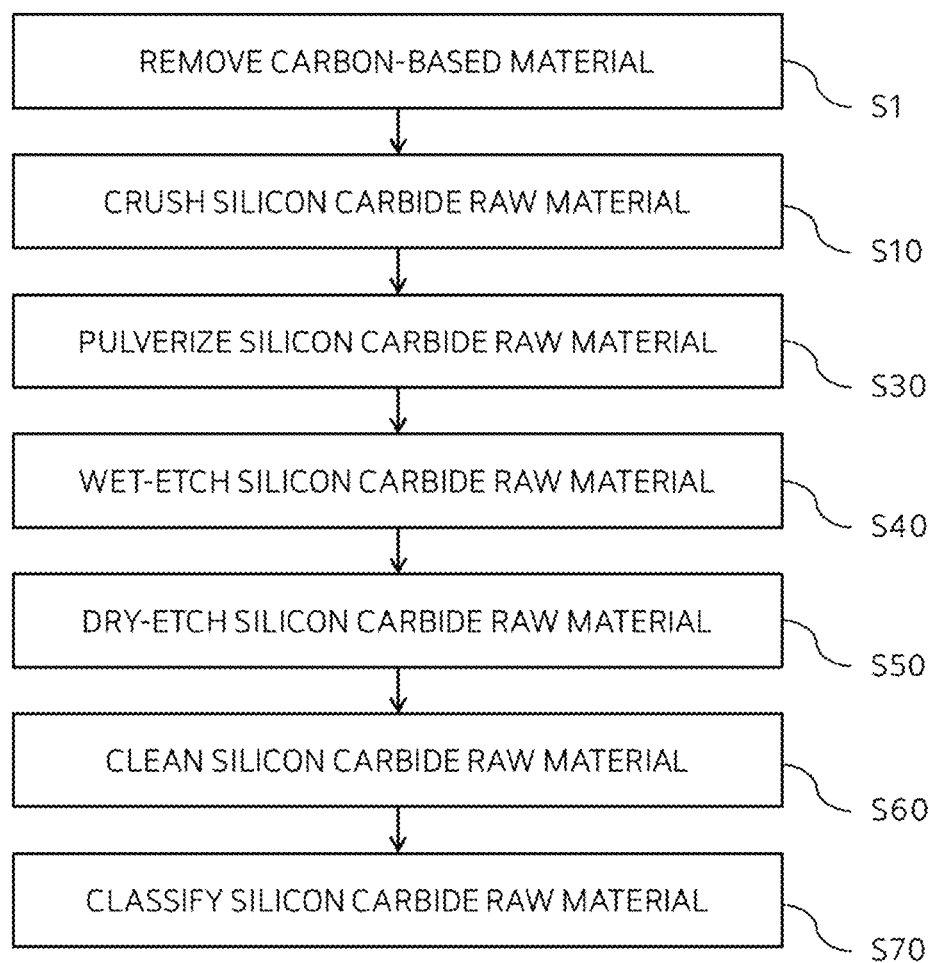
FIG. 2 is a flowchart illustrating a process of manufacturing a silicon carbide powder according to one embodiment.

Referring to FIG. 2, a silicon carbide powder according to one embodiment may be manufactured by the following process.

In this embodiment, a process substantially the same as the process of FIG. 1 is carried out, but before the crushing process, a carbon-based material removal process may be carried out (Si).

When the silicon carbide raw material contains a large amount of carbon as an impurity, the carbon-based material removal process may be preceded. For example, when the silicon carbide raw material includes a graphite component in a high ratio as in a graphite component coated with silicon carbide, the carbon-based material removal process may be performed first.

Since the carbon-based material is first removed (Si) and then the crushing process (S10) is performed, the carbon-based material included in the silicon carbide raw material may be efficiently removed.

Therefore, the method of manufacturing a silicon carbide powder according to the embodiment may provide a silicon carbide powder of high purity by using a silicon carbide raw material including a carbon-based material in a high content.

Figure 3:
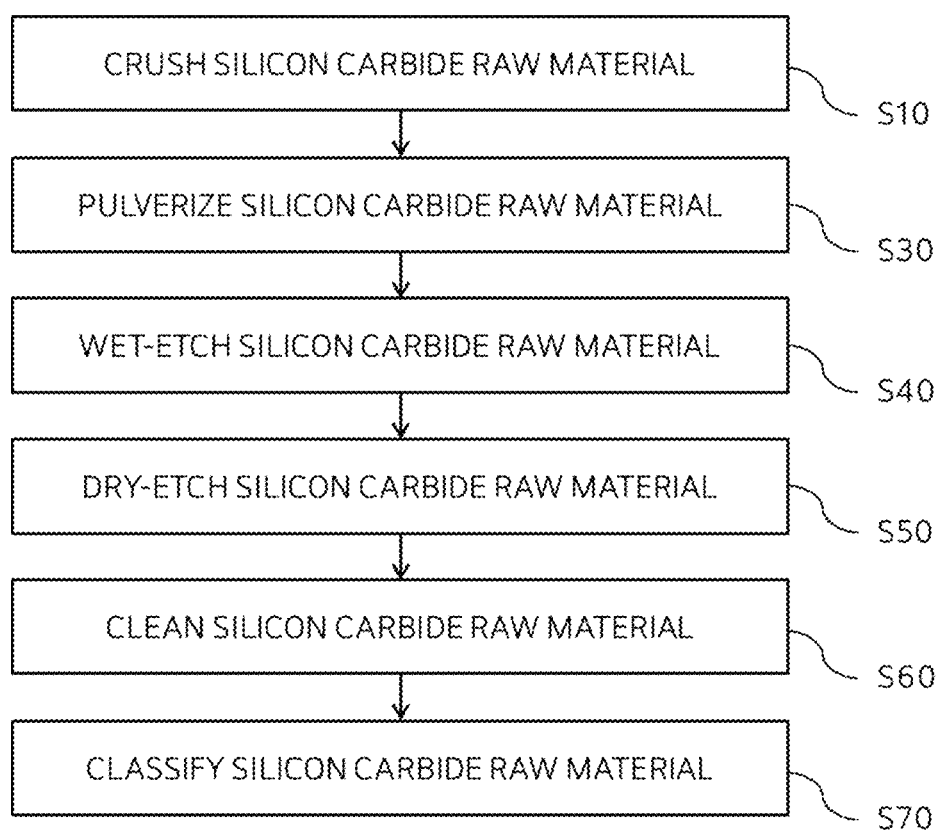
FIG. 3 is a flowchart illustrating a process of manufacturing a silicon carbide powder according to one embodiment.

Referring to FIG. 3, a silicon carbide powder according to one embodiment may be manufactured by the following process.

In this embodiment, a process substantially the same as the process of FIG. 1 is carried out, but the carbon-based material removal process may be omitted.

When the silicon carbide raw material does not include the carbon-based material such as graphite or includes the same in a very low content, the carbon-based material removal process may be omitted. For example, the silicon carbide raw material may include silicon carbide in an amount of about 95% by weight or more as in a monocrystal silicon carbide ingot, polycrystal silicon carbide, or a silicon carbide sintered body. In this case, in the wet etching process, etc., a small amount of carbon-based material is removed so that a silicon carbide powder with high purity may be obtained without a separate additional process.

Figure 4:
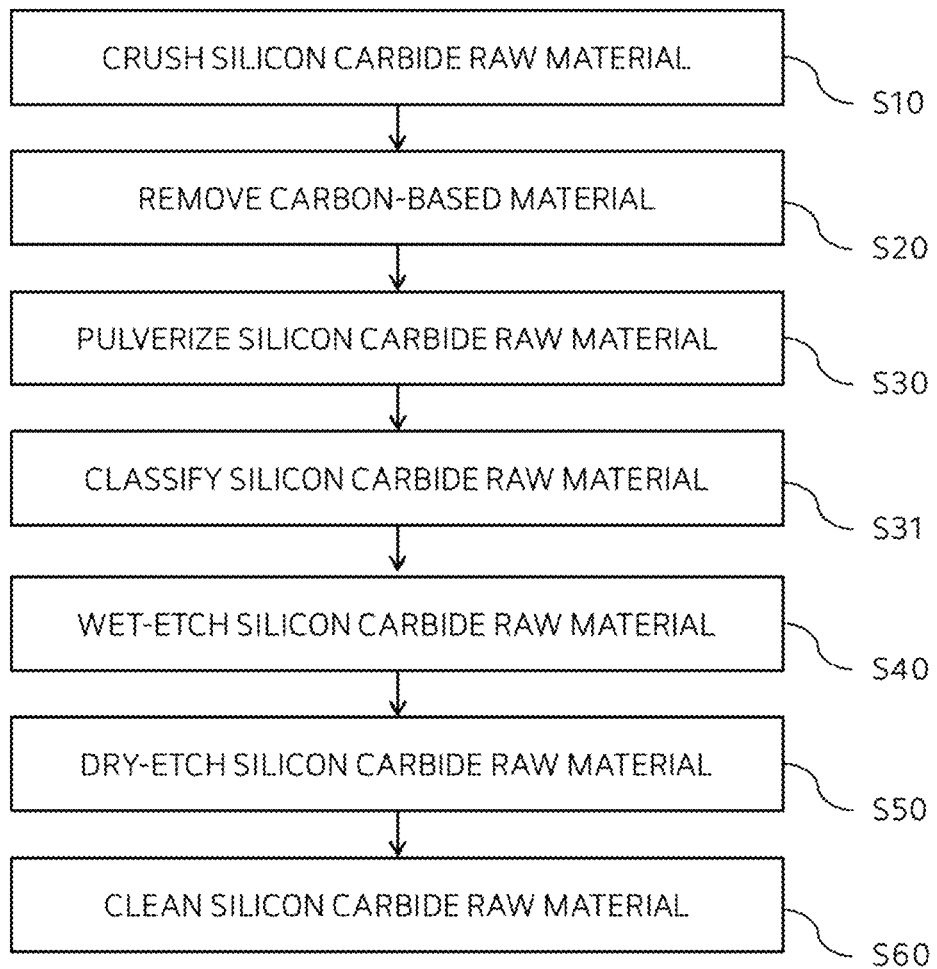
FIG. 4 is a flowchart illustrating a process of manufacturing a silicon carbide powder according to one embodiment.
Figure 5:
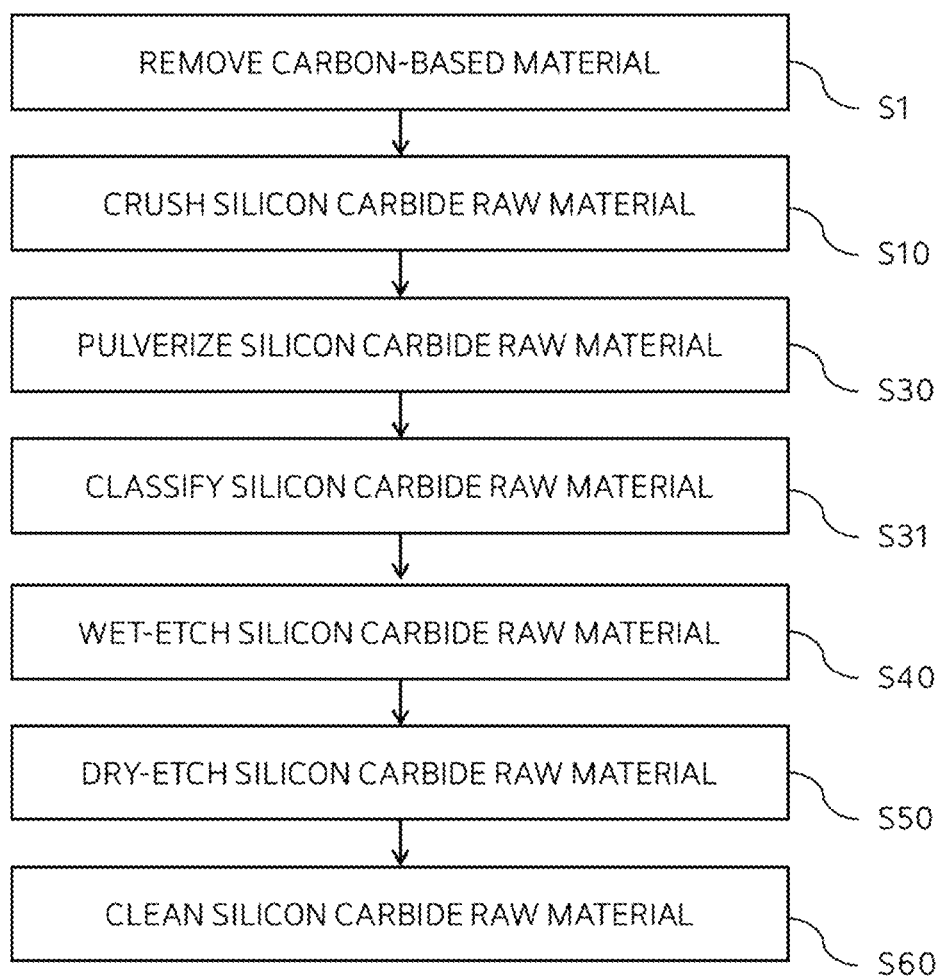
FIG. 5 is a flowchart illustrating a process of manufacturing a silicon carbide powder according to one embodiment.
Figure 6:
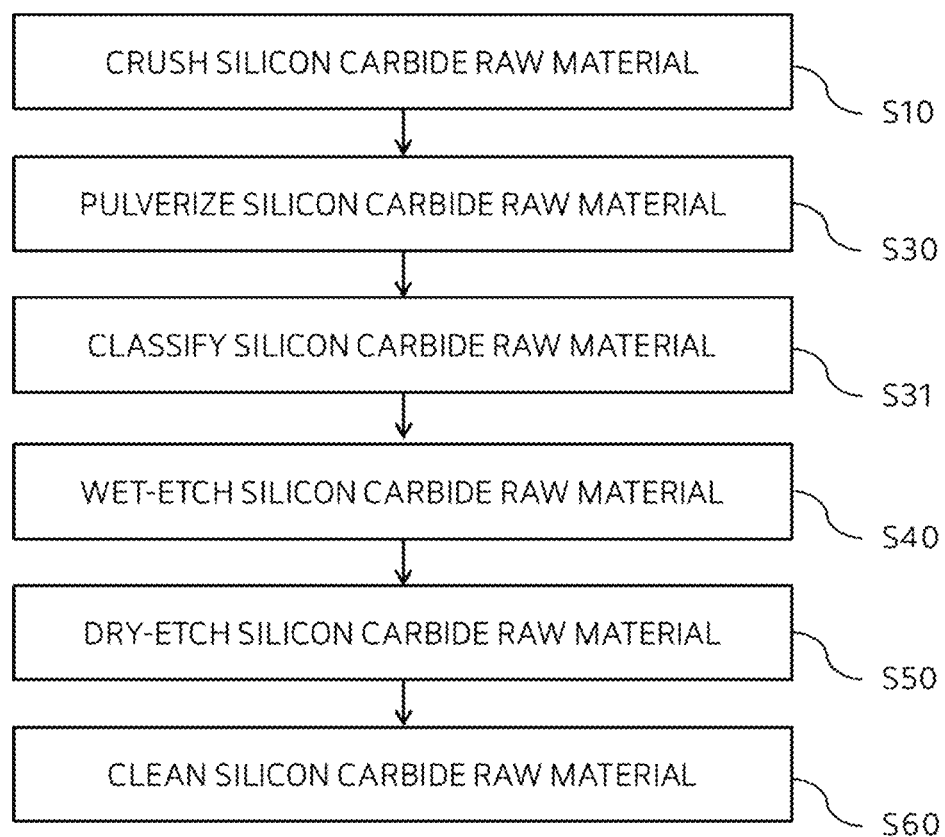
FIG. 6 is a flowchart illustrating a process of manufacturing a silicon carbide powder according to one embodiment.

Referring to FIGS. 4 to 6, the silicon carbide powder according to one embodiment may be manufactured by the following process.

In this embodiment, a process substantially the same as the process of FIG. 1, 2, or 3 is carried out, but the classification process (S31) may be performed immediately after the pulverization process (S30). That is, the pulverized silicon carbide raw material may be classified into particles having a desired particle size by the classification process performed immediately after the pulverization process. The classified silicon carbide raw material may be subjected to the wet etching process, the dry etching process, and the cleaning process.

In this embodiment, since the silicon carbide raw material is subjected to the wet etching process and the dry etching process after being classified into particles having a uniform particle diameter, the entire surface of the silicon carbide raw material may be uniformly etched. In particular, since the silicon carbide raw material is classified into particles having a uniform particle diameter, the space between the particles of the silicon carbide raw material may be uniformly formed. Accordingly, the etching gas may uniformly permeate into the space between the silicon carbide raw material particles, and the dry etching process may uniformly etch the silicon carbide raw materials as a whole.

Accordingly, the method of manufacturing a silicon carbide powder according to the embodiment may uniformly control the content of carbon, silicon, and oxygen included in the surface of the silicon carbide raw material as a whole.

The purity of the silicon carbide powder according to an embodiment may be about 99.99% or more. The purity of the silicon carbide powder according to an embodiment may be about 99.999% or more. The purity of the silicon carbide powder according to an embodiment may be about 99.9999% or more. The purity of the silicon carbide powder according to an embodiment may be about 99.999999% or more. The purity of the silicon carbide powder according to an embodiment may be about 99.9999999% or more. The purity of the silicon carbide powder according to an embodiment may be about 99.9999999% or more. The purity of the silicon carbide powder according to an embodiment may be about 99.99999999% or more.

The silicon carbide powder according to an embodiment may include at least one impurity selected from the group consisting of lithium, sodium, magnesium, aluminum, potassium, calcium, titanium, vanadium, chromium, manganese, iron, cobalt, nickel, copper, zinc, and molybdenum in an amount of about 1 ppm or less, about 0.8 ppm or less, about 0.7 ppm or less, about 0.1 to about 0.7 ppm or about 0.1 to about 0.6 ppm.

In addition, the particle diameter (D50) of the silicon carbide powder according to an embodiment may be about 10 μm to about 10000 μm. The particle diameter (D50) of the silicon carbide powder according to an embodiment may be about 100 μm to about 6000 μm. The particle diameter (D50) of the silicon carbide powder according to an embodiment may be about 60 μm to about 5000 μm. The particle diameter (D50) of the silicon carbide powder according to an embodiment may be about 100 μm to about 4000 μm. The particle diameter (D50) of the silicon carbide powder according to an embodiment may be about 150 μm to about 400 μm. The particle diameter (D50) of the silicon carbide powder according to an embodiment may be about 300 μm to about 800 μm. The particle diameter (D50) of the silicon carbide powder according to an embodiment may be about 500 μm to about 1000 μm. The particle diameter (D50) of the silicon carbide powder according to an embodiment may be about 700 μm to about 2000 μm. The particle diameter (D50) of the silicon carbide powder according to an embodiment may be about 1000 μm to about 3000 μm.

The silicon carbide powder according to an embodiment includes carbon and oxygen in an appropriate content ratio on the surface thereof. Accordingly, when a silicon carbide ingot and a silicon carbide wafer is made of the silicon carbide powder according to an embodiment, defects of the silicon carbide ingot and the silicon carbide wafer may be reduced because the content of the oxygen is appropriate.

In particular, since carbon and oxygen are included in an appropriate content ratio on the surface of the silicon carbide powder, the oxygen may be easily removed by reacting with the carbon in an initial heat treatment step. Accordingly, oxygen on the surface of the silicon carbide powder may be removed in the initial heat treatment process, and defects in the process of growing the silicon carbide ingot may be minimized.

In addition, the oxygen is removed in the form of carbon dioxide by reacting with the carbon, and in the process of removing the oxygen, the consumption of the carbon may be reduced. Accordingly, even after the oxygen is removed together with the carbon, the ratio of the silicon and the carbon may be appropriate over an entirety of the silicon carbide powder. Accordingly, the silicon carbide powder according to an embodiment may minimize defects that may occur due to non-uniform content of the carbon and the silicon.

In addition, the silicon carbide powder according to an embodiment includes silicon and oxygen in an appropriate content ratio on the surface thereof. Accordingly, the silicon carbide powder according to an embodiment may be effectively protected from external impurities. That is, the silicon carbide powder according to an embodiment may include an oxygen-containing protective film on the surface thereof and may be effectively protected from external chemical impact.

In addition, the silicon carbide powder according to an embodiment may include the fluorine component as a by-product in the manufacturing process. Here, since the method of manufacturing the silicon carbide powder according to an embodiment includes the wet etching process, the dry etching process, and the cleaning process, the content of the fluorine component is low. In addition, since a process of manufacturing a silicon carbide ingot includes a process of heat-treating the silicon carbide powder according to an embodiment, the fluorine component may be efficiently removed. That is, the fluorine component may be evaporated and easily removed in the initial heat treatment process.

The silicon carbide powder according to an embodiment has a very high purity, and by using the silicon carbide powder, a silicon carbide wafer with improved performance may be manufactured.

The particle shape of the silicon carbide powder according to an embodiment may be analyzed through 2D image analysis.

The silicon carbide powder according to an embodiment may be appropriately sampled and may be subjected to the 2D image analysis. For example, the silicon carbide powder according to the embodiment may be sampled in an amount of about 0.1 g to about 10 g at a time and may be sampled in an amount that can be used about 5 times to about 100 times, and the 2D image analysis is performed for each sampling. In this case, measurement values derived through the 2D image analysis may be obtained, and the characteristic of the silicon carbide powder according to the embodiment may be defined as an average value of the measurement values.

The sampled silicon carbide powder is sprinkled on a background. The background may have a color visually distinct from the silicon carbide powder. Each of the sprinkled silicon carbide particles is spaced apart from each other and arranged so as not to overlap each other.

The particles included in the silicon carbide powder according to the embodiment are photographed by an optical microscope, and a two-dimensional image of the particles is obtained.

Next, the 2D image of the silicon carbide powder according to the embodiment may be analyzed by image analysis software. Examples of the image analysis software include the iSolution series manufactured by IMT (Image & Microscope Technology).

When the silicon carbide powder according to the embodiment is analyzed by the 2D image analysis, the average area of particles included in the silicon carbide powder may be about 50,000 $\mu m^2$ to 5,000,000 $\mu m^2$. When the silicon carbide powder according to the embodiment is analyzed by the 2D image analysis, the average area of particles included in the silicon carbide powder may be about 50,000 $\mu m^2$ to 100,000 $\mu m^2$. When the silicon carbide powder according to the embodiment is analyzed by the 2D image analysis, the average area of particles included in the silicon carbide powder may be about 150,000 $\mu m^2$ to 250,000 $\mu m^2$. When the silicon carbide powder according to the embodiment is analyzed by the 2D image analysis, the average area of particles included in the silicon carbide powder may be about 1,000,000 $\mu m^2$ to 2,000,000 $\mu m^2$. When the silicon carbide powder according to the embodiment is analyzed by the 2D image analysis, the average area of particles included in the silicon carbide powder may be about 2,500,000 $\mu m^2$ to 3,500,000 $\mu m^2$. When the silicon carbide powder according to the embodiment is analyzed by the 2D image analysis, the average area of particles included in the silicon carbide powder may be about 3,500,000 $\mu m^2$ to 5,000,000 $\mu m^2$.

When the silicon carbide powder according to the embodiment is analyzed by the 2D image analysis, the average circumferential length of particles included in the silicon carbide powder may be about 500 $\mu m$ to about 10 mm. When the silicon carbide powder according to the embodiment is analyzed by the 2D image analysis, the average circumferential length of particles included in the silicon carbide powder may be about 500 $\mu m$ to about 1.5 mm. When the silicon carbide powder according to the embodiment is analyzed by the 2D image analysis, the average circumferential length of particles included in the silicon carbide powder may be about 1.5 mm to about 2.5 mm. When the silicon carbide powder according to the embodiment is analyzed by the 2D image analysis, the average circumferential length of particles included in the silicon carbide powder may be about 4 mm to about 6 mm. When the silicon carbide powder according to the embodiment is analyzed by the 2D image analysis, the average circumferential length of particles included in the silicon carbide powder may be about 7 mm to about 10 mm.

When the silicon carbide powder according to the embodiment is analyzed by the 2D image analysis, the average equivalent circle diameter of particles included in the silicon carbide powder may be about 150 $\mu m$ to about 3 mm. The equivalent circle diameter is calculated based on an area. That is, assuming a circle equal to the area, the equivalent circle diameter may mean the diameter of the circle. When the silicon carbide powder according to the embodiment is analyzed by the 2D image analysis, the average equivalent circle diameter of particles included in the silicon carbide powder may be about 150 $\mu m$ to about 300 $\mu m$. When the silicon carbide powder according to the embodiment is analyzed by the 2D image analysis, the average equivalent circle diameter of particles included in the silicon carbide powder may be about 300 $\mu m$ to about 700 gum. When the silicon carbide powder according to the embodiment is analyzed by the 2D image analysis, the average equivalent circle diameter of particles included in the silicon carbide powder may be about 1000 $\mu m$ to about 1500 $\mu m$. When the silicon carbide powder according to the embodiment is analyzed by the 2D image analysis, the average equivalent circle diameter of particles included in the silicon carbide powder may be about 1500 gum to about 2300 gum. When the silicon carbide powder according to the embodiment is analyzed by the 2D image analysis, the average equivalent circle diameter of particles included in the silicon carbide powder may be about 2000 $\mu m$ to about 2500 $\mu m$.

When the silicon carbide powder according to the embodiment is analyzed by the 2D image analysis, the average maximum elliptical diameter of particles included in the silicon carbide powder may be about 300 $\mu m$ to about 3500 $\mu m$. When the silicon carbide powder according to the embodiment is analyzed by the 2D image analysis, the average maximum elliptical diameter of particles included in the silicon carbide powder may be about 300 $\mu m$ to about 400 $\mu m$. When the silicon carbide powder according to the embodiment is analyzed by the 2D image analysis, the average maximum elliptical diameter of particles included in the silicon carbide powder may be about 600 $\mu m$ to about 750 $\mu m$. When the silicon carbide powder according to the embodiment is analyzed by the 2D image analysis, the average maximum elliptical diameter of particles included in the silicon carbide powder may be about 1000 $\mu m$ to about 2000 µm. When the silicon carbide powder according to the embodiment is analyzed by the 2D image analysis, the average maximum elliptical diameter of particles included in the silicon carbide powder may be about 2500 µm to about 3500 µm. When the silicon carbide powder according to the embodiment is analyzed by the 2D image analysis, the average maximum elliptical diameter of particles included in the silicon carbide powder may be about 550 µm to about 800 µm.

When the silicon carbide powder according to the embodiment is analyzed by the 2D image analysis, the average minimum elliptical diameter of particles included in the silicon carbide powder may be about 150 µm to about 2500 µm. When the silicon carbide powder according to the embodiment is analyzed by the 2D image analysis, the average minimum elliptical diameter of particles included in the silicon carbide powder may be about 150 µm to about 250 µm. When the silicon carbide powder according to the embodiment is analyzed by the 2D image analysis, the average minimum elliptical diameter of particles included in the silicon carbide powder may be about 300 µm to about 500 µm. When the silicon carbide powder according to the embodiment is analyzed by the 2D image analysis, the average minimum elliptical diameter of particles included in the silicon carbide powder may be about 850 µm to about 1300 µm. When the silicon carbide powder according to the embodiment is analyzed by the 2D image analysis, the average minimum elliptical diameter of particles included in the silicon carbide powder may be about 1300 µm to about 1900 µm. When the silicon carbide powder according to the embodiment is analyzed by the 2D image analysis, the average minimum elliptical diameter of particles included in the silicon carbide powder may be about 1700 µm to about 2500 µm.

When the silicon carbide powder according to the embodiment is analyzed by the 2D image analysis, the average maximum length of particles included in the silicon carbide powder may be about 250 µm to about 3000 µm. Here, the maximum length may mean a length in the longest direction in the 2D image of each particle. When the silicon carbide powder according to the embodiment is analyzed by the 2D image analysis, the average maximum length of particles included in the silicon carbide powder may be about 250 µm to about 400 µm. When the silicon carbide powder according to the embodiment is analyzed by the 2D image analysis, the average maximum length of particles included in the silicon carbide powder may be about 500 µm to about 800 µm. When the silicon carbide powder according to the embodiment is analyzed by the 2D image analysis, the average maximum length of particles included in the silicon carbide powder may be about 1300 µm to about 1800 µm. When the silicon carbide powder according to the embodiment is analyzed by the 2D image analysis, the average maximum length of particles included in the silicon carbide powder may be about 1700 µm to about 2300 µm. When the silicon carbide powder according to the embodiment is analyzed by the 2D image analysis, the average maximum length of particles included in the silicon carbide powder may be about 2200 µm to about 3000 µm.

When the silicon carbide powder according to the embodiment is analyzed by the 2D image analysis, the average maximum frame diameter of particles included in the silicon carbide powder according to the embodiment may be about 300 µm to about 3500 µm. As the photographed image of the particles is rotated, it may be measured with a virtual vernier caliper. Here, the maximum frame diameter may mean the largest of measured widths. When the silicon carbide powder according to the embodiment is analyzed by the 2D image analysis, the average maximum frame diameter of particles included in the silicon carbide powder according to the embodiment may be about 300 µm to about 450 µm. When the silicon carbide powder according to the embodiment is analyzed by the 2D image analysis, the average maximum frame diameter of particles included in the silicon carbide powder according to the embodiment may be about 500 µm to about 900 µm. When the silicon carbide powder according to the embodiment is analyzed by the 2D image analysis, the average maximum frame diameter of particles included in the silicon carbide powder according to the embodiment may be about 1300 µm to about 2000 µm. When the silicon carbide powder according to the embodiment is analyzed by the 2D image analysis, the average maximum frame diameter of particles included in the silicon carbide powder according to the embodiment may be about 2200 µm to about 2600 µm. When the silicon carbide powder according to the embodiment is analyzed by the 2D image analysis, the average maximum frame diameter of particles included in the silicon carbide powder according to the embodiment may be about 2700 µm to about 3500 µm.

When the silicon carbide powder according to the embodiment is analyzed by the 2D image analysis, the average minimum frame diameter of particles included in the silicon carbide powder according to the embodiment may be about 150 µm to about 2200 µm. As the photographed image of the particles is rotated, it may be measured with a virtual vernier caliper. Here, the minimum frame diameter may mean the smallest of measured widths. When the silicon carbide powder according to the embodiment is analyzed by the 2D image analysis, the average minimum frame diameter of particles included in the silicon carbide powder according to the embodiment may be about 150 µm to about 280 µm. When the silicon carbide powder according to the embodiment is analyzed by the 2D image analysis, the average minimum frame diameter of particles included in the silicon carbide powder according to the embodiment may be about 350 µm to about 450 µm. When the silicon carbide powder according to the embodiment is analyzed by the 2D image analysis, the average minimum frame diameter of particles included in the silicon carbide powder according to the embodiment may be about 750 µm to about 1250 µm. When the silicon carbide powder according to the embodiment is analyzed by the 2D image analysis, the average minimum frame diameter of particles included in the silicon carbide powder according to the embodiment may be about 1300 gum to about 1800 gum. When the silicon carbide powder according to the embodiment is analyzed by the 2D image analysis, the average minimum frame diameter of particles included in the silicon carbide powder according to the embodiment may be about 1800 µm to about 2200 µm.

When the silicon carbide powder according to the embodiment is analyzed by the 2D image analysis, the average minimum frame diameter of particles included in the silicon carbide powder according to the embodiment may be about 250 µm to about 2700 µm. As the photographed image of the particles is rotated, it may be measured with a virtual vernier caliper. Here, the middle frame diameter may mean the average of measured widths. When the silicon carbide powder according to the embodiment is analyzed by the 2D image analysis, the average minimum frame diameter of particles included in the silicon carbide powder according to the embodiment may be about 250 µm to about 350 µm. When the silicon carbide powder according to the embodiment is analyzed by the 2D image analysis, the average minimum frame diameter of particles included in the silicon carbide powder according to the embodiment may be about 400 µm to about 600 µm. When the silicon carbide powder according to the embodiment is analyzed by the 2D image analysis, the average minimum frame diameter of particles included in the silicon carbide powder according to the embodiment may be about 1250 µm to about 1700 µm. When the silicon carbide powder according to the embodiment is analyzed by the 2D image analysis, the average minimum frame diameter of particles included in the silicon carbide powder according to the embodiment may be about 1800 gum to about 2200 gum. When the silicon carbide powder according to the embodiment is analyzed by the 2D image analysis, the average minimum frame diameter of particles included in the silicon carbide powder according to the embodiment may be about 2300 µm to about 2700 µm.

When the silicon carbide powder according to the embodiment is analyzed by the 2D image analysis, the average convex hull of particles included in the silicon carbide powder according to the embodiment may be about 700 µm to about 10000 µm. When the silicon carbide powder according to the embodiment is analyzed by the 2D image analysis, the average convex hull of particles included in the silicon carbide powder according to the embodiment may be about 700 µm to about 1300 µm. When the silicon carbide powder according to the embodiment is analyzed by the 2D image analysis, the average convex hull of particles included in the silicon carbide powder according to the embodiment may be about 1600 µm to about 2200 µm. When the silicon carbide powder according to the embodiment is analyzed by the 2D image analysis, the average convex hull of particles included in the silicon carbide powder according to the embodiment may be about 4000 µm to about 5000 µm. When the silicon carbide powder according to the embodiment is analyzed by the 2D image analysis, the average convex hull of particles included in the silicon carbide powder according to the embodiment may be about 6000 µm to about 7000 µm. When the silicon carbide powder according to the embodiment is analyzed by the 2D image analysis, the average convex hull of particles included in the silicon carbide powder according to the embodiment may be about 7000 gum to about 9000 µm.

When the silicon carbide powder according to the embodiment is analyzed by the 2D image analysis, the average particle circularity of particles included in the silicon carbide powder according to the embodiment may be 0.4 to 0.9. When the silicon carbide powder according to the embodiment is analyzed by the 2D image analysis, the average particle circularity of particles included in the silicon carbide powder according to the embodiment may be 0.4 to 0.8. When the silicon carbide powder according to the embodiment is analyzed by the 2D image analysis, the average particle circularity of particles included in the silicon carbide powder according to the embodiment may be 0.45 to 0.75. When the silicon carbide powder according to the embodiment is analyzed by the 2D image analysis, the average particle circularity of particles included in the silicon carbide powder according to the embodiment may be 0.5 to 0.7. When the silicon carbide powder according to the embodiment is analyzed by the 2D image analysis, the average particle circularity of particles included in the silicon carbide powder according to the embodiment may be 0.55 to 0.7.

The particle circularity may be calculated according to the following equation.

$$\text{Particle circularity} = 4 \times \pi \times \text{particle area}/(\text{circumference length})^2 \quad \text{[Equation 1]}$$

When the silicon carbide powder according to the embodiment is analyzed by the 2D image analysis, the average particle ellipticity of particles included in the silicon carbide powder according to the embodiment may be 0.85 to 1. When the silicon carbide powder according to the embodiment is analyzed by the 2D image analysis, the average particle ellipticity of particles included in the silicon carbide powder according to the embodiment may be 0.90 to 1. When the silicon carbide powder according to the embodiment is analyzed by the 2D image analysis, the average particle ellipticity of particles included in the silicon carbide powder according to the embodiment may be 0.91 to 1. When the silicon carbide powder according to the embodiment is analyzed by the 2D image analysis, the average particle ellipticity of particles included in the silicon carbide powder according to the embodiment may be 0.93 to 1. In an embodiment, the particle ellipticity measured through the 2D image analysis may be 0.92 or more.

When the silicon carbide powder according to the embodiment is analyzed by the 2D image analysis, the average particle curvature of particles included in the silicon carbide powder according to an embodiment may be about 0.83 to about 0.99.

The particle curvature may be calculated according to Equation 2 below.

$$\text{Particle curvature} = \text{convex hull}/\text{circumference length} \quad \text{[Equation 2]}$$

When the silicon carbide powder according to the embodiment is analyzed by the 2D image analysis, the average particle curvature of particles included in the silicon carbide powder according to an embodiment may be about 0.83 to about 0.99. When the silicon carbide powder according to the embodiment is analyzed by the 2D image analysis, the average particle curvature of particles included in the silicon carbide powder according to an embodiment may be about 0.84 to about 0.98. When the silicon carbide powder according to the embodiment is analyzed by the 2D image analysis, the average particle curvature of particles included in the silicon carbide powder according to an embodiment may be about 0.85 to about 0.95. When the silicon carbide powder according to the embodiment is analyzed by the 2D image analysis, the average particle curvature of particles included in the silicon carbide powder according to an embodiment may be about 0.86 to about 0.94. In an embodiment, the particle curvature measured through the 2D image analysis may be 0.9 to 0.99.

When the silicon carbide powder according to the embodiment is analyzed by the 2D image analysis, the average particle elongation of particles included in the silicon carbide powder according to an embodiment may be about 0.8 to about 0.95.

The particle elongation may be calculated according to Equation 3 below.

$$\text{Particle elongation} = \text{equivalent circle diameter}/\text{maximum length} \quad \text{[Equation 3]}$$

The shape of the 2D image of the particle contracts as a particle elongation approaches 1, and the shape of the 2D image of the particle is elongated as a particle elongation approaches 0.

When the silicon carbide powder according to the embodiment is analyzed by the 2D image analysis, the average particle elongation of particles included in the silicon carbide powder according to an embodiment may be about 0.81 to about 0.95. When the silicon carbide powder according to the embodiment is analyzed by the 2D image analysis, the average particle elongation of particles included in the silicon carbide powder according to an embodiment may be about 0.82 to about 0.94. When the silicon carbide powder according to the embodiment is analyzed by the 2D image analysis, the average particle elongation of particles included in the silicon carbide powder according to an embodiment may be about 0.83 to about 0.93.

When the silicon carbide powder according to the embodiment is analyzed by the 2D image analysis, the average charge space elongation of particles included in the silicon carbide powder according to an embodiment may be 0.65 to 0.85.

The charge space elongation may be calculated according to Equation 4 below.

$$\text{Charge space elongation} = \text{equivalent circle diameter} / \text{maximum frame diameter} \quad \text{[Equation 4]}$$

The space occupied by the particles contracts as a charge space elongation approaches 1. In addition, the space occupied by particles is elongated as a charge space elongation approaches 0.

When the silicon carbide powder according to the embodiment is analyzed by the 2D image analysis, the average charge space elongation of particles included in the silicon carbide powder according to an embodiment may be 0.68 to 0.83. When the silicon carbide powder according to the embodiment is analyzed by the 2D image analysis, the average charge space elongation of particles included in the silicon carbide powder according to an embodiment may be 0.70 to 0.83. When the silicon carbide powder according to the embodiment is analyzed by the 2D image analysis, the average charge space elongation of particles included in the silicon carbide powder according to an embodiment may be 0.70 to 0.80. When the silicon carbide powder according to the embodiment is analyzed by the 2D image analysis, the average charge space elongation of particles included in the silicon carbide powder according to an embodiment may be 0.73 to 0.80.

When the silicon carbide powder according to the embodiment is analyzed by the 2D image analysis, the average charge space curvature of particles included in the silicon carbide powder according to an embodiment may be 0.7 to 0.96.

The charge space curvature may be calculated according to Equation 5 below.

$$\text{Charge space curvature} = \text{equivalent circle diameter} / \text{middle frame diameter} \quad \text{[Equation 5]}$$

When the silicon carbide powder according to the embodiment is analyzed by the 2D image analysis, the average charge space curvature of particles included in the silicon carbide powder according to an embodiment may be 0.75 to 0.94. When the silicon carbide powder according to the embodiment is analyzed by the 2D image analysis, the average charge space curvature of particles included in the silicon carbide powder according to an embodiment may be 0.79 to 0.94. When the silicon carbide powder according to the embodiment is analyzed by the 2D image analysis, the average charge space curvature of particles included in the silicon carbide powder according to an embodiment may be 0.83 to 0.94. When the silicon carbide powder according to the embodiment is analyzed by the 2D image analysis, the average charge space curvature of particles included in the silicon carbide powder according to an embodiment may be 0.85 to 0.94. When the silicon carbide powder according to the embodiment is analyzed by the 2D image analysis, the average charge space curvature of particles included in the silicon carbide powder according to an embodiment may be 0.85 to 0.93.

Figure 7:
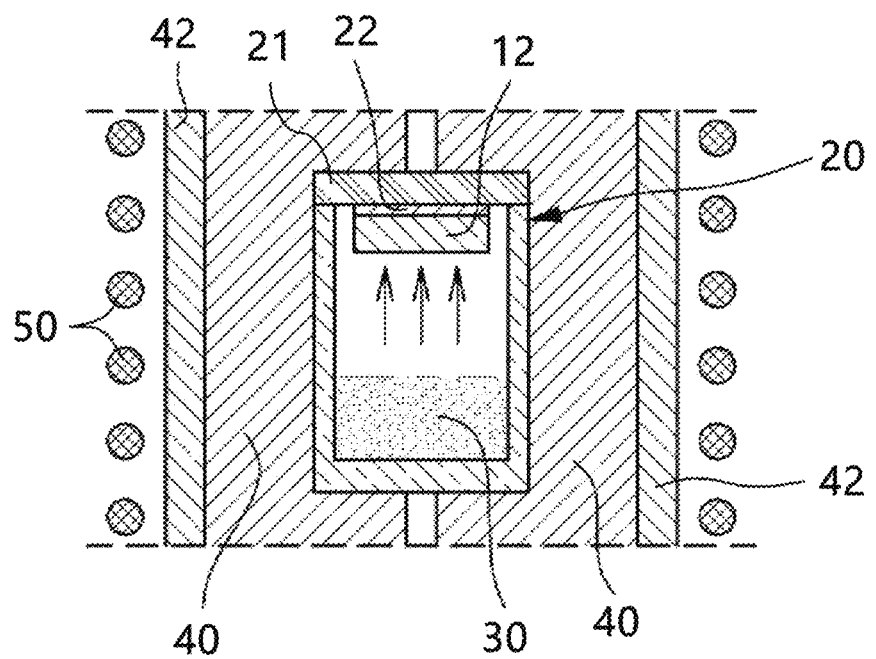
FIG. 7 is a sectional view illustrating a process of growing a silicon carbide ingot.
Figure 8:
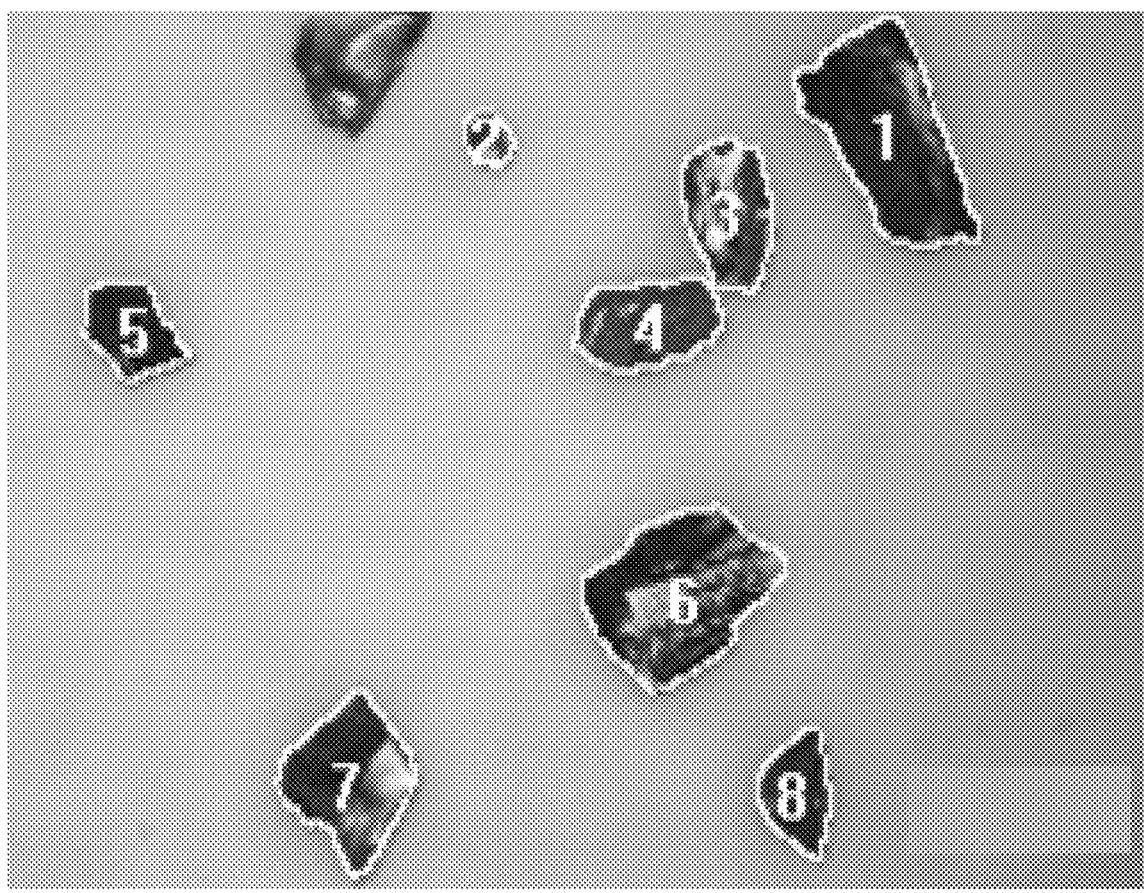
FIG. 8 illustrates the 2D image of particles included in a silicon carbide powder manufactured according to Manufacturing Example 1.
Figure 9:
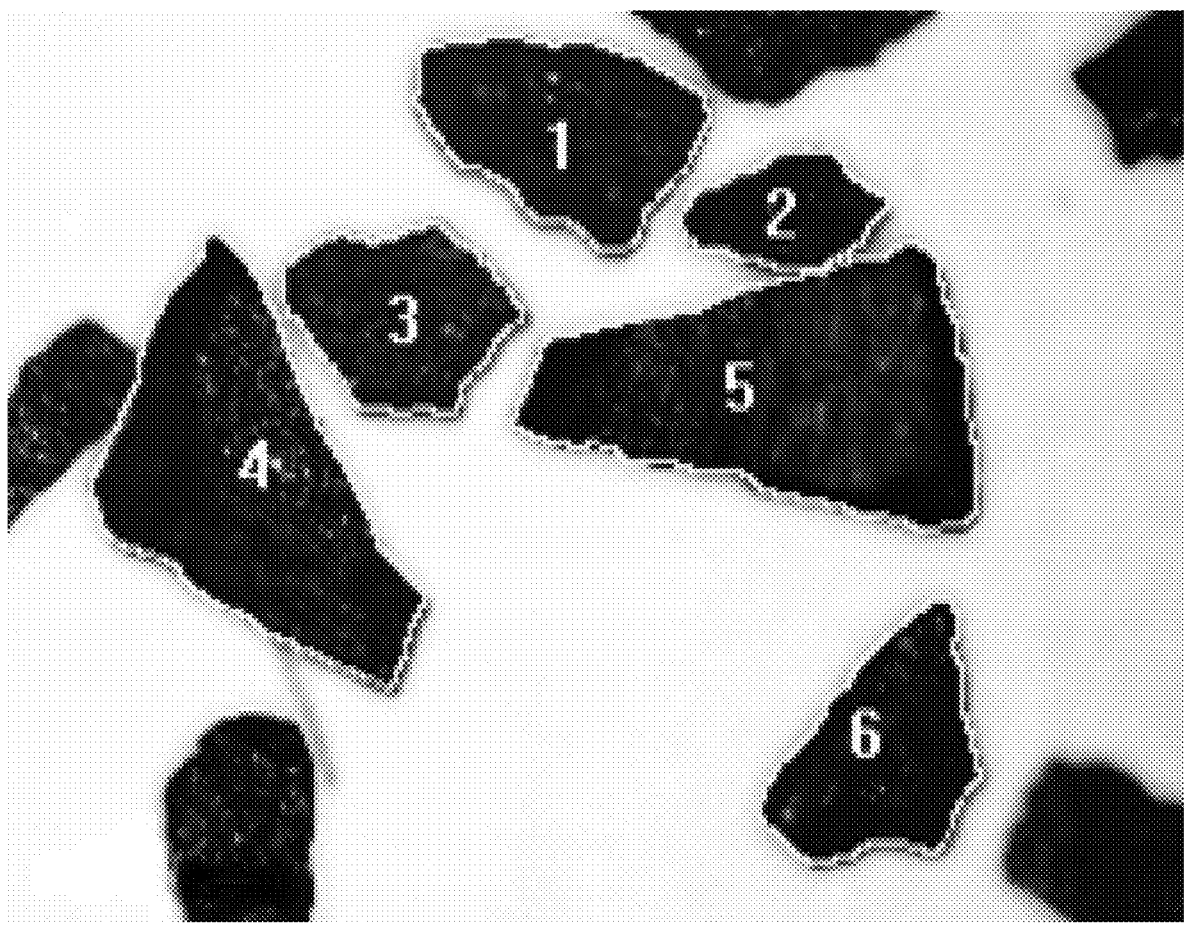
FIG. 9 illustrates the 2D image of particles included in a silicon carbide powder manufactured according to Manufacturing Example 2.

Referring to FIG. 7, the silicon carbide wafer according to an embodiment may be manufactured as follows.

First, a silicon carbide ingot may be manufactured. The silicon carbide ingot is manufactured by applying a physical vapor transport method (PVT) to have a large area and few defects.

The method of manufacturing a silicon carbide ingot 12 according to an embodiment may include a preparation step, a silicon carbide powder charging step, and a growth step.

The preparation step is a step of preparing a crucible assembly including a crucible body 20 having an inner space and a crucible cover 21 for covering the crucible body.

The silicon carbide powder charging step is a step of charging the silicon carbide powder 30 in the crucible assembly and disposing a seed on the raw material at a regular interval from the raw material.

The crucible body 20 may have, for example, a cylindrical shape having an opening with an open upper surface, wherein a silicon carbide raw material can be charged in the crucible body 20. The density of the crucible body 20 may be 1.70 g/cm$^3$ to 1.90 g/cm$^3$. The material of the crucible body 20 may include graphite.

The density of the crucible cover 21 may be 1.70 g/cm$^3$ to 1.90 g/cm$^3$. The material of the crucible cover 21 may include graphite. The crucible cover 21 may have a shape to cover the entire opening of the crucible body 20.

The crucible cover 21 may cover a portion of the opening of the crucible body 20 or may include a through hole (not shown). In this case, it is possible to control the speed of vapor transport in the crystal growth atmosphere to be described below.

In addition, a seed holder 22 is disposed on the crucible cover 21. The seed holder 22 may be coupled to the crucible cover 21. The seed holder 22 may be attached to the crucible cover 21. The seed holder 22 may be integrally formed with the crucible cover 21.

The thickness of the crucible cover 21 may be about 10 mm to about 50 mm. In addition, the thickness of the seed holder 22 may be about 1 mm to about 10 mm.

To manufacture the silicon carbide ingot, a seed is prepared. The seed may be any one of wafers to which an off angle, which is an angle selected in a range of 0 to 8 degrees with respect to the (0001) plane, is applied.

The seed may be a substantially single-crystal 4H SiC ingot with minimal defects or polymorph incorporation. The silicon carbide seed may be substantially made of 4H SiC.

The seed may have a diameter of 4 inches or more, 5 inches or more, and further 6 inches or more. More specifically, the seed may have a diameter of 4 to 12 inches, 4 to 10 inches, or 6 to 8 inches.

The seed is attached to a seed holder. The seed holder includes graphite. The seed holder may be made of graphite. The seed holder may include anisotropic graphite. In more detail, the seed holder may be made of anisotropic graphite.

In addition, the seed and the seed holder are adhered to each other by an adhesive layer. The adhesive layer includes a graphite filler and a carbide such as a phenol resin. The adhesive layer may have a low porosity.

The seed may be disposed such that the C surface thereof faces downward.

Next, to form the silicon carbide ingot inside the crucible, the silicon carbide powder according to an embodiment is charged in the crucible.

The silicon carbide powder 30 includes a carbon source and a silicon source. Specifically, the silicon carbide powder 30 includes a carbon-a silicon source. The silicon carbide powder 30 may have the characteristics described above.

The silicon carbide powder 30 having a particle size of 75 µm or less may be included in an amount of 15% by weight or less, 10% by weight or less, or 5% by weight or less based on a total weight of the raw material. As such, when a raw material having a relatively small content of particles with a small particle size is applied, a silicon carbide ingot that can reduce the occurrence of defects in the ingot, is more advantageous in controlling supersaturation, and can provide a wafer with improved crystal properties may be manufactured.

The silicon carbide powder 30 may be necked or not necked to each other. When a raw material having such a particle size is applied, it is possible to manufacture a silicon carbide ingot that provides a wafer having superior crystal properties.

In the silicon carbide powder charging step, the crucible assembly may have a weight ratio (Rw) of 1.5 to 2.7 (times) of the weight of the silicon carbide powder when the weight of the silicon carbide powder 30 is 1. Here, the weight of the crucible assembly means the weight of the crucible assembly excluding the raw material, and specifically, means a value obtained by excluding the weight of the inputted raw material from the crucible assembly including the seed regardless of whether a seed holder is applied to the crucible assembly.

When the weight ratio is less than 1.5, the degree of supersaturation in the crystal growth atmosphere is excessively increased, and thus the crystal quality of the ingot may be rather deteriorated. When the weight ratio exceeds 2.7, the degree of supersaturation is lowered, and thus the crystal quality of the ingot may be deteriorated.

The weight ratio may be 1.6 to 2.6 or 1.7 to 2.4. Within such a weight ratio, an ingot having excellent defect characteristics or crystallinity characteristics can be manufactured.

In the crucible assembly, when the diameter of the inner space of the crucible body 20 is 1, a length ratio from the lowest surface where the silicon carbide powder 30 is located to the surface of the seed 11 may be more than 1 times and not more than 25 times.

The growth step is a step of adjusting the inner space of the crucible body 20 to a crystal growth atmosphere so that the raw material is vapor transferred to the seed and deposited thereon, thereby preparing a silicon carbide ingot grown from the seed.

The growth step includes a process of adjusting the inner space of the crucible assembly to a crystal growth atmosphere, and specifically, may be carried out in a manner of wrapping the crucible assembly with an insulating material 40 to prepare a reaction vessel (not shown) including the crucible assembly and the insulating material surrounding the crucible assembly and heating the crucible by a heating means after placing the reaction vessel in a reaction chamber such as a quartz tube.

The reaction vessel is located in the reaction chamber 42 the inner space of the crucible body 20 is induced to a temperature suitable for the crystal growth atmosphere by the heating means. Such a temperature is one of important factors in the crystal growth atmosphere, and a more suitable crystal growth atmosphere is formed by controlling conditions such as pressure and gas movement. The insulating material 40 may be placed between the reaction chamber 42 and the reaction vessel to help the formation and control of a crystal growth atmosphere more easily.

The insulating material 40 may affect the temperature gradient inside the crucible body or inside the reaction vessel in the growth atmosphere. Specifically, the insulating material may include a graphite insulating material, and more specifically, the insulating material may include rayon-based graphite felt or pitch-based graphite felt.

As an embodiment, the insulating material may have a density of about 0.12 g/cc to about 0.30 g/cc. As an embodiment, the insulating material may have a density of about 0.13 g/cc to about 0.25 g/cc. As an embodiment, the insulating material may have a density of about 0.14 g/cc to about 0.20 g/cc.

When the insulating material having a density of less than about 0.14 g/cc is applied, the shape of a grown ingot may be concave, and 6H-SiC polymorphism may occur, resulting in poor quality of the ingot.

When the insulating material having a density of greater than about 0.30 g/cc is applied, a grown ingot may be excessively convex, and a growth rate of the edge may be lowered to decrease the yield or increase the occurrence of cracks in the ingot.

When the insulating material having a density of about 0.12 g/cc to about 0.30 g/cc is applied, the quality of an ingot may be improved. When the insulating material having a density of about 0.14 g/cc to about 0.20 g/cc is applied, it is possible to control the crystal growth atmosphere in the ingot growth process and to grow an ingot of better quality.

The insulating material may have a porosity of about 73 vol % to about 95 vol %. The insulating material may have a porosity of about 76 vol % to about 93 vol %. The insulating material may have a porosity of 81 vol % to 91 vol %. When the insulating material having such a porosity is applied, the frequency of ingot cracking may be further reduced.

The insulating material may have a compressive strength of about 0.21 Mpa or more. The insulating material may have a compressive strength of about 0.49 Mpa or more. The insulating material may have a compressive strength of about 0.78 MPa or more. In addition, the insulating material may have a compressive strength of about 3 MPa or less or about 25 MPa or less. When the insulating material has such a compressive strength, thermal/mechanical stability is excellent and the probability of ash generation is low, so that a SiC ingot of better quality may be manufactured.

The insulating material may be applied to a thickness of about 20 mm or more, or may be applied to a thickness of about 30 mm or more. In addition, the insulating material may be applied to a thickness of about 150 mm or less, may be applied to a thickness of about 120 mm or less, or may be applied to a thickness of about 80 mm or less. When the insulating material is applied to such a thickness range, the insulating effect may be sufficiently obtained without unnecessary waste of the insulating material.

The insulating material 40 may have a density of about 0.12 g/cc to about 0.30 g/cc. The insulating material 40 may have a porosity of about 72 vol % to about 90 vol %. When such an insulating material 40 is applied, the shape of an ingot may be suppressed from growing concave or excessively convex, and the deterioration of polymorphic quality and the occurrence of cracks in the ingot may be reduced.

The crystal growth atmosphere may be realized by heating the heating means 50 outside the reaction chamber 42. Simultaneously with or separately from the heating, air is removed by decompression, and a reduced pressure atmosphere and/or an inert atmosphere (e.g., Ar atmosphere, N2 atmosphere, or a mixed atmosphere thereof) may be used.

The crystal growth atmosphere induces the growth of silicon carbide crystals by vapor transporting the raw material to the surface of the seed to grow into the ingot 100.

In the crystal growth atmosphere, a growth temperature of 2100° C. to 2450° C. and a growth pressure condition of 1 torr to 100 torr may be applied, and when these temperatures and pressures are applied, a silicon carbide ingot may be manufactured more efficiently.

Specifically, to the crystal growth atmosphere, conditions of a crucible upper and lower-surface temperature, i.e., a growth temperature, of 2100° C. to 2450° C. and a growth pressure of 1 torr to 50 torr may be applied, and more specifically, conditions of a crucible upper and lower-surface temperature, a growth temperature, of 2150° C. to 2450° C. and a growth pressure of 1 torr to 40 torr may be applied.

More specifically, conditions of a crucible upper and lower-surface temperature, i.e., a growth temperature, of 2150 to 2350° C. and a growth pressure of 1 torr to 30 torr may be applied.

When the above-described crystal growth atmosphere is applied, a silicon carbide ingot of a higher quality may be more advantageously manufactured by the manufacturing method of the present invention.

The silicon carbide ingot 12 contains 4H SiC and may have a convex or flat surface.

When the surface of the silicon carbide ingot 12 is formed in a concave shape, other polymorphs such as 6H-SiC may be mixed in addition to the intended 4H-SiC crystal, which may degrade the quality of the silicon carbide ingot. In addition, when the surface of the silicon carbide ingot is formed in an excessively convex shape, cracks may occur in the ingot itself, or crystals may be broken when processing into a wafer.

Here, whether the silicon carbide ingot 12 is an excessively convex ingot is determined based on the degree of curvature, and the curvature of the silicon carbide ingot manufactured according to the present specification is about 20 mm or less.

The curvature is evaluated as a value of (center height−edge height) by placing a sample, on which the growth of a silicon carbide ingot is completed, on a surface plate and measuring the height of the center of the ingot and the height of the edge of the ingot with a height gauge based on the rear surface of the ingot. In the curvature value, a positive value means convexity, 0 means flatness, and a negative value means concave.

Specifically, the surface of the silicon carbide ingot 12 may have a convex shape or a flat shape, and the curvature of the silicon carbide ingot 12 may be about 0 mm to about 14 mm, about 0 mm to about 11 mm, or about 0 mm to about 8 mm. A silicon carbide ingot having such a curvature degree may make wafer processing easier and reduce cracking.

The silicon carbide ingot 12 may be a substantially monocrystal 4H SiC ingot with minimal defects or polymorph incorporation. The silicon carbide ingot 12 is substantially made of 4H SiC, and the surface thereof may have a convex shape or a flat shape.

The silicon carbide ingot 12 may reduce defects that may occur in a silicon carbide ingot and may provide a silicon carbide wafer with higher quality.

In the case of the silicon carbide ingot manufactured by the method of the present specification, pits on the surface of the silicon carbide ingot may be reduced. Specifically, in an ingot having a diameter of 4 inches or more, pits included in the surface thereof may be about 10 k/cm$^2$ or less.

In the present specification, for the surface pit measurement of the silicon carbide ingot, a total of 5 position including one position of the central part, except for the facet, on the ingot surface and 3 o'clock, 6 o'clock, 9 o'clock, and 12 o'clock positions located within about 10 mm from the edge of the silicon carbide ingot toward the center is observed with an optical microscope, pits per unit area (1 cm2) at each location are measured, and an average value of the pits is used for evaluation.

For example, the outer edge of the silicon carbide ingot is trimmed using external grinding equipment (external grinding) and, after cutting to a certain thickness (slicing), processing such as edge grinding, surface grinding, or polishing may be carried out.

The slicing step is a step of preparing a sliced crystal by slicing a silicon carbide ingot to have a certain off-angle. The off-angle is based on the (0001) plane in 4H SiC. Specifically, the off-angle may be an angle selected from 0 to 15, may be an angle selected from 0 to 12, or may be an angle selected from 0 to 8.

The slicing is not specifically limited so long as it is a slicing method that is generally applied to wafer manufacturing, and for example, cutting using a diamond wire or a wire to which a diamond slurry is applied, cutting using a blade or wheel to which diamond is partially applied, etc. may be applied, without being limited thereto.

The thickness of the sliced crystal may be adjusted in consideration of the thickness of the wafer to be manufactured, and may be sliced to an appropriate thickness in consideration of the thickness after being polished in a polishing step to be described below.

In addition, the slicing starts at a place about 3° away from the point where the outer circumferential surface of the silicon carbide ingot and the second direction meet, and proceeds in the second direction. That is, the direction in which the slicing proceeds may be a direction deviated by about 3° from the second direction. That is, the movement direction of the sawing wire for the slicing may be a direction inclined by about 3° from a direction perpendicular to the second direction. That is, the extension direction of the sawing wire is a direction inclined by about 3° from a direction perpendicular to the second direction, and the silicon carbide ingot may be gradually trimmed and cut in a direction inclined by about 3° from the second direction.

Accordingly, in the slicing process, the occurrence of stress in the first direction may be minimized. That is, in the slicing process, since no pressure is applied in the first direction in the slicing process, the stress in the first direction may be minimized, and the deviation of the peak omega angle in the first direction may be minimized.

The polishing step is a step of polishing the sliced crystal to a thickness of 300 to 800 μm to form a silicon carbide wafer.

In the polishing step, a polishing method commonly applied to wafer manufacturing may be applied, and, for example, after a process such as lapping and/or grinding is performed, polishing, etc. may be applied.

The silicon carbide wafer according to an embodiment may have a low surface oxygen concentration. In the silicon carbide wafer according to an embodiment, the surface oxygen concentration measured by the X-ray photoelectron spectroscopy may be about 5 atom % to about 14 atom %. In the silicon carbide wafer according to an embodiment, the surface oxygen concentration measured by the X-ray photoelectron spectroscopy may be about 6 atom % to about 13 atom %. In the silicon carbide wafer according to an embodiment, the surface oxygen concentration measured by the X-ray photoelectron spectroscopy may be about 7 atom % to about 12.5 atom %. In the silicon carbide wafer according to an embodiment, the surface oxygen concentration measured by the X-ray photoelectron spectroscopy may be about 8 atom % to about 12 atom %.

Accordingly, since the silicon carbide wafer according to the embodiment has a low surface oxygen content, a high yield may be realized when used in a manufacturing process of a power semiconductor device. The silicon carbide wafer according to the embodiment may have a yield of about 88% or more with respect to a manufactured power semiconductor device. That is, the method of manufacturing a power semiconductor device using a silicon carbide wafer according to the embodiment may provide a yield of about 88% or more.

The silicon carbide powder according to an embodiment has particle circularity in an appropriate range. In addition, the silicon carbide powder according to an embodiment may have a particle ellipticity in an appropriate range. In addition, the silicon carbide powder according to an embodiment may have a particle curvature in an appropriate range. In addition, the silicon carbide powder according to an embodiment may have a particle elongation in an appropriate range. In addition, the silicon carbide powder according to an embodiment may have a charge space elongation in an appropriate range. In addition, the silicon carbide powder according to an embodiment may have a charge space curvature in an appropriate range.

Accordingly, when the silicon carbide powder according to an embodiment is filled in a crucible to manufacture a silicon carbide ingot and a silicon carbide wafer, an appropriate shape allowing the implementation of an appropriate porosity and an appropriate thermal conductivity can be provided.

Accordingly, when the silicon carbide powder according to an embodiment is filled in the crucible, improved thermal conductivity in a horizontal direction and a porosity in an appropriate range can be provided. Accordingly, when the silicon carbide powder according to an embodiment is filled in the crucible and heated for the growth of the silicon carbide ingot, a uniform temperature gradient in the horizontal direction can be provided, and the silicon carbide gas sublimated into the pores can be easily transferred to the silicon carbide seed.

Accordingly, the silicon carbide powder according to an embodiment can transfer the sublimated silicon carbide gas upward at an improved rate and at a uniform rate. Therefore, the silicon carbide powder according to an embodiment can improve the growth rate of the silicon carbide ingot. In addition, since the silicon carbide gas is sublimed at a uniform rate as a whole, defects of the silicon carbide ingot and the silicon carbide wafer can be reduced.

The growth process of the silicon carbide ingot can depend upon the particle shape of the silicon carbide powder according to the embodiment. At this time, the particle shape and particle surface properties of the silicon carbide powder can be appropriately controlled by the crushing process, the pulverizing process, and the etching process. Through the 2D image analysis, the particle shape and particle surface characteristics of the silicon carbide powder according to an embodiment can be determined. When the silicon carbide powder according to an embodiment has a particle circularity, particle ellipticity, particle curvature, particle elongation, charge space elongation, and charge space curvature in appropriate ranges, it can have a particle shape and surface that positively affect the growth of the silicon carbide ingot.

Hereinafter, the present invention will be described in detail through specific examples. The following examples are provided only to help the understanding of embodiments, and the scope of the invention disclosed in the present specification is not limited thereto.

Manufacturing Example 1

A monocrystal silicon carbide lump was provided as a silicon carbide raw material. The monocrystal silicon carbide lump may be formed by sublimating a silicon carbide powder having a purity of about 99.9999% or more at a temperature of about 2300° C. and depositing it on a seed.

The monocrystal silicon carbide lump was first crushed by a jaw crusher (Henan Dewo Industrial Limited Company, KER-100×60). From the crushed silicon carbide lump, a primary powder having an average particle diameter (D50) of about 6 mm was obtained.

Next, the primary powder was secondarily pulverized by a ball mill (Ganzhou Li Ang Machinery Co., Ltd., QM400*600). Here, a steel ball having a diameter of about 25.4 mm was placed in the cylinder, and the diameter of the cylinder was about 400 mm. In addition, a rotation speed of the cylinder was about 20 rpm, and the secondary pulverization process was performed for about 15 minutes. The secondarily pulverized primary powder was classified by a classifier, and a secondary powder having an average particle diameter (D50) of about 500 μm was obtained.

Next, the secondary powder was heat-treated at a temperature of about 1200° C. in an air atmosphere about 1200° C. for about 24 to remove free carbon and free silicon.

Next, the heat-treated silicon carbide powder was purified by a wet etching process.

Deionized water, hydrofluoric acid, and nitric acid were mixed in a volume ratio of about 2:1:1 to prepare an etchant.

Next, about 1 f of the heat-treated silicon carbide powder was fed into an etch vessel having a volume of about 5 f, and about 0.8 f of the etchant was fed thereinto.

Next, the etch vessel was sealed with a lid. Here, oil vapor generated in the etch vessel was discharged through the lid, and the oil vapor was recovered by a scrubber.

The etchant and the heat-treated silicon carbide powder were stirred at a speed of about 26 rpm for about 1 hour.

Next, the etchant was drained, and the wet-etched silicon carbide powder was neutralized with deionized water by the following process. The wet-etched silicon carbide powder was immersed in deionized water, and after stirring, the deionized water was discharged. This immersion and discharge process was repeated until the pH of the discharged deionized water reached 7.

Next, the neutralized silicon carbide powder was dried at about 80° C. for about 30 minutes.

Next, the dried silicon carbide powder was placed in a graphite crucible.

Next, the internal temperature of the crucible was increased up to about 2000° C., and the inside of the crucible was depressurized to a pressure of about 8 torr.

Next, an etching gas in which argon and chlorine gas were mixed in a volume ratio of about 10:1 was introduced into the crucible, and the pressure inside the crucible was increased to about 760 torr. Here, the temperature of the crucible was set so that the temperature of the lower part of the crucible was about 50° C. higher than the temperature of the upper part of the crucible. This state was maintained for about 2 days.

Next, the etching gas inside the crucible was recovered by a scrubber, and the inside of the crucible in which the dry-etched silicon carbide powder was disposed was heat-treated at about 1000° C. in an air atmosphere for about 10 hours.

Next, the heat-treated silicon carbide powder was immersed in an aqueous hydrofluoric acid solution at a concentration of about 0.5 wt %, and the silicon carbide powder and the aqueous hydrofluoric acid solution were stirred for about 1 hour.

Next, the silicon carbide powder treated with the aqueous hydrofluoric acid solution was immersed in ultrapure water, and the ultrapure water was drained. This process was repeated. Here, the immersion and drainage processes were repeated until the concentration of hydrofluoric acid contained in the drained ultrapure water was lowered to about 0.0001 wt % or less.

Manufacturing Examples 2 to 6

Manufacturing Examples 2 to 6 were substantially the same as Manufacturing Example 1, and a primary crushing process and secondary pulverization process as in Table 1 below were performed.

TABLE 1

| Classification | Average particle diameter (D50, mm) of primary powder an | Ball diameter (mm) | Cylinder rotation speed (rpm) | Secondary pulverization time (min) | Average particle diameter (D50, μm) of secondary powder |
|---|---|---|---|---|---|
| Manufacturing Example 1 | 6 | 25.4 | 20 | 35 | 150 |
| Manufacturing Example 2 | 6 | 25.4 | 20 | 15 | 500 |
| Manufacturing Example 3 | 6 | 25.4 | 20 | 10 | 1000 |
| Manufacturing Example 4 | 10 | 37 | 20 | 10 | 2000 |
| Manufacturing Example 5 | 10 | 25.4 | 20 | 8 | 3000 |
| Manufacturing Example 6 | 8 | 37 | 25 | 20 | 450 |

As in Tables 2 to 4 below, the silicon carbide powders of Manufacturing Examples 1 to 6 were subjected to 2D image analysis.

TABLE 2

| Classification | Area (μm²) | Circumference (μm) | Equivalent circle diameter (μm) | Maximum ellipse diameter (μm) | Minimum ellipse diameter (μm) | Maximum length (μm) |
|---|---|---|---|---|---|---|
| Manufacturing Example 1 | 60784 | 1047 | 269 | 346 | 219 | 325 |
| Manufacturing Example 2 | 211101 | 1976 | 493 | 677 | 391 | 604 |
| Manufacturing Example 3 | 1418513 | 5317 | 1317 | 1592 | 1124 | 1509 |
| Manufacturing Example 4 | 2826066 | 7534 | 1878 | 2282 | 1577 | 2153 |
| Manufacturing Example 5 | 4172793 | 8922 | 2298 | 2750 | 1963 | 2594 |
| Manufacturing Example 6 | 227093 | 2043 | 526 | 688 | 721 | 601 |

TABLE 3

| Classification | Maximum frame diameter (μm) | Minimum frame diameter (μm) | Middle frame diameter (μm) | Convex hull (μm) | Particle circularity | Particle ellipticity | Particle curvature |
|---|---|---|---|---|---|---|---|
| Manufacturing Example 1 | 373 | 232 | 308 | 979 | 0.670 | 0.974 | 0.939 |
| Manufacturing Example 2 | 713 | 464 | 598 | 1854 | 0.617 | 0.951 | 0.940 |
| Manufacturing Example 3 | 1689 | 1178 | 1455 | 4642 | 0.615 | 0.9766 | 0.879 |
| Manufacturing Example 4 | 2401 | 1650 | 2066 | 6590 | 0.613 | 0.978 | 0.875 |
| Manufacturing Example 5 | 2904 | 2019 | 2496 | 7939 | 0.657 | 0.9833 | 0.891 |
| Manufacturing Example 6 | 723 | 467 | 608 | 1915 | 0.662 | 0.970 | 0.938 |

TABLE 4

| Classification | Particle elongation | Charge space elongation | Charge space curvature |
|---|---|---|---|
| Manufacturing Example 1 | 0.862 | 0.745 | 0.890 |
| Manufacturing Example 2 | 0.816 | 0.691 | 0.824 |
| Manufacturing Example 3 | 0.891 | 0.778 | 0.904 |
| Manufacturing Example 4 | 0.872 | 0.782 | 0.909 |
| Manufacturing Example 5 | 0.905 | 0.796 | 0.921 |
| Manufacturing Example 6 | 0.875 | 0.727 | 0.865 |

Example

Next, the silicon carbide powder produced in Manufacturing Example 1 was charged into a graphite crucible body. A silicon carbide seed and a seed holder were placed on the powder. Here, the C surface (0001) of the silicon carbide seed crystal was fixed in a conventional manner to face the lower part of the crucible. In addition, a crucible cover and a seed holder were integrally manufactured with graphite, and both the crucible cover and the seed crystal holder had a disk shape. Here, the thickness of the crucible cover was about 20 mm, the diameter of the crucible cover was about 210 mm, the thickness of the seed holder was about 3 mm, and the diameter of the seed holder was about 180 mm.

The main body of the crucible was covered with the crucible cover in which the seed and the seed holder were installed, surrounded by a heat insulating material, and placed in a reaction chamber provided with a heating coil as a heating means.

Here, graphite felt having a density of about 0.19 g/cc, a porosity of about 85 vol %, and a compressive strength of about 0.37 MPa was applied as an insulation material.

After making the inside of the crucible in a vacuum state, argon gas was slowly injected thereinto so that the inside of the crucible reached atmospheric pressure. The inside of the crucible was gradually decompressed again. At the same time, the temperature inside the crucible was gradually increased to 2000° C. at a temperature increase rate of about 3° C./min, and then gradually increased to 2350° C. at a temperature increase rate of about 5° C./min.

Next, a SiC ingot was grown from a silicon carbide seed for 100 hours under conditions of a temperature of 2350° C. and a pressure of 20 torr.

Next, the silicon carbide ingot was cut by a diamond wire saw, and processed by a chamfering process, a grinding process, and a grinding process. Accordingly, a silicon carbide wafer having an off angle of 4 degrees with respect to the (0001) plane was manufactured.

Examples 2 to 7 and Comparative Example

As summarized in Table 5 below, the same process as in Example 1 was carried out except that the silicon carbide powder was changed.

TABLE 5

| Classification | Silicon carbide powder | Porosity (vol %) |
|---|---|---|
| Example 1 | Manufacturing Example 1 | 48.2 |
| Example 2 | Manufacturing Example 2 | 47.5 |
| Example 3 | Manufacturing Example 3 | 48.8 |
| Example 4 | Manufacturing Example 4 | 48.1 |
| Example 5 | the manufacturing example 5 | 47.8 |
| Example 6 | the manufacturing example 6 | 48.5 |
| Comparative Example | Carborex manufactured by Washington Mills | 48.3 |

TABLE 6

| Classification | Growth rate (μm/hr) | Defect (EPD/cm$^2$) |
|---|---|---|
| Example 1 | 280 | 9920 |
| Example 3 | 282 | 7820 |
| Example 4 | 271 | 9620 |
| Example 5 | 268 | 14340 |
| Example 6 | 275 | 14920 |
| Example 7 | 271 | 13760 |
| Comparative Example | 250 | 16354 |

Measurement Example

1. Silicon Carbide Powder Purity

The purity of the silicon carbide powder according to the manufacturing example was measured by glow discharge mass spectrometry.

2. Silicon Carbide Powder Shape

The silicon carbide powder manufactured in the manufacturing example was sampled about 30 times in a weight of about 1 g. The sample was photographed with an optical microscope (Eclipse LV150 Microscope, manufactured by Nikon), and analyzed by an image analysis program (i-solution, manufactured by IMT). The area, circumference, equivalent circle diameter, maximum ellipse diameter, minimum ellipse diameter, maximum length, maximum frame diameter, minimum frame diameter, middle frame diameter, and convex hull of each particle were measured. The measurement values of each particle were calculated as an average value.

As summarized in Table 6, the silicon carbide powders manufactured according to the examples have a particle circularity, particle ellipticity, particle curvature, particle elongation, charge space elongation, and charge space curvature within appropriate ranges, so that a silicon carbide ingot having a high growth rate and few defects can be manufactured.

DESCRIPTION OF SYMBOLS crucible body 20
insulating material 40
silicon carbide ingot 12

The invention claimed is:

1. A silicon carbide powder, comprising carbon and silicon,
    wherein a particle circularity measured through 2D image analysis is 0.4 to 0.9,
    wherein a particle curvature measured through the 2D image analysis is 0.8 to 0.99, wherein a particle elongation measured through the 2D image analysis is 0.7 to 0.95, and wherein an equivalent circle diameter measured through the 2D image analysis is 150 µm to 3 mm.

2. The silicon carbide powder according to claim 1, wherein a particle ellipticity measured through the 2D image analysis is 0.92 or more.

3. The silicon carbide powder according to claim 1, wherein a charge space elongation measured through the 2D image analysis is 0.6 to 0.9.

4. The silicon carbide powder according to claim 1, wherein a charge space curvature measured through the 2D image analysis is 0.8 to 0.95.

5. The silicon carbide powder according to claim 1, wherein the equivalent circle diameter measured through the 2D image analysis is 200 µm to 350 µm.

6. The silicon carbide powder according to claim 1, wherein the equivalent circle diameter measured through the 2D image analysis is 350 µm to 700 µm.

7. The silicon carbide powder according to claim 1, wherein the equivalent circle diameter measured through the 2D image analysis is 800 µm to 30003500 µm.

8. A method of manufacturing a silicon carbide wafer, the method comprising:

preparing a silicon carbide powder comprising a silicon carbide powder carbon and silicon and having a particle circularity of 0.4 to 0.9 measured through 2D image analysis;

growing a silicon carbide ingot using the silicon carbide powder; and processing the silicon carbide ingot, wherein a particle curvature measured through the 2D image analysis is 0.8 to 0.99, wherein a particle elongation measured through the 2D image analysis is 0.7 to 0.95, and wherein an equivalent circle diameter measured through the 2D image analysis is 150 µm to 3 mm.

9. The method according to claim 8, wherein in the growing, the silicon carbide powder is filled in a crucible, wherein the silicon carbide powder filled in the crucible has a porosity of 10 vol % to 50 vol %, and in the growing, the silicon carbide ingot has a growth rate of 250 µm/hr to 400 µm/hr.

* * * * *